US012615934B2

(12) United States Patent
Hsu et al.

(10) Patent No.: US 12,615,934 B2
(45) Date of Patent: Apr. 28, 2026

(54) LIGHT EMITTING ELEMENT AND METHOD FOR MANUFACTURING THE SAME

(71) Applicant: TAIZHOU GUANYU TECHNOLOGY CO., LTD., Zhejiang Province (CN)

(72) Inventors: Kuo-Cheng Hsu, Taichung City (TW); Chih-Cheng Yen, Hsinchu County (TW); Huei-Siou Chen, Taipei City (TW); Ker Tai Chu, Taipei City (TW)

(73) Assignee: TAIZHOU GUANYU TECHNOLOGY CO., LTD., Zhejiang Province (CN)

( * ) Notice: Subject to any disclaimer, the term of this patent is extended or adjusted under 35 U.S.C. 154(b) by 492 days.

(21) Appl. No.: 18/308,669

(22) Filed: Apr. 27, 2023

(65) Prior Publication Data

US 2023/0371327 A1     Nov. 16, 2023

(30) Foreign Application Priority Data

May 11, 2022  (CN) .......................... 202210515112.5
Aug. 15, 2022  (CN) .......................... 202210973295.5

(51) Int. Cl.
H10K 59/131 (2023.01)
H10K 59/12 (2023.01)
(Continued)

(52) U.S. Cl.
CPC ....... H10K 59/131 (2023.02); H10K 59/1201 (2023.02); H10K 59/8051 (2023.02);
(Continued)

(58) Field of Classification Search
None
See application file for complete search history.

(56) References Cited

U.S. PATENT DOCUMENTS 10,811,466 B2   10/2020  Guo et al.
2011/0127500 A1 *  6/2011  Ko ......................... H10K 59/35
                                                 438/35
(Continued)

FOREIGN PATENT DOCUMENTS

CN         1512825 A      7/2004
CN       105336760 A      2/2016
(Continued)

OTHER PUBLICATIONS

Office Action, Cited References and Search Report dated Jun. 4, 2025 issued by the China National Intellectual Property Administration (CNIPA) for the China Counterpart Application No. 202210973295.5.

(Continued)

*Primary Examiner* — Kyoung Lee
(74) *Attorney, Agent, or Firm* — WPAT LAW; Anthony King

(57) ABSTRACT

A light emitting element includes a light emitting array, a plurality of cladding layers and an insulating photosensitive material layer. The light emitting array includes a first organic light emitting unit and a second organic light emitting unit. The first organic light emitting unit includes a first electrode, and the second organic light emitting unit includes a second electrode. The plurality of cladding layers includes a first cladding layer and a second cladding layer, wherein the first cladding layer covers a portion of an upper surface and a sidewall of the first electrode, and the second cladding layer covers a portion of an upper surface and a sidewall of the second electrode. The insulating photosensitive material layer is located between the sidewall of the first electrode and the sidewall of the second electrode, and the insulating photosensitive material layer partially covers the upper surface of the first electrode.

19 Claims, 27 Drawing Sheets

(51) Int. Cl.

| | |
|---|---|
| *H10K 59/80* | (2023.01) |
| *H10K 59/95* | (2023.01) |
| *H10K 71/00* | (2023.01) |
| *H10K 71/60* | (2023.01) |
| *H10K 102/10* | (2023.01) |

(52) U.S. Cl.
CPC ............. *H10K 59/95* (2023.02); *H10K 71/60* (2023.02); *H10K 71/621* (2023.02); *H10K 2102/10* (2023.02)

(56) References Cited

U.S. PATENT DOCUMENTS

| | | |
|---|---|---|
| 2018/0240822 A1 | 8/2018 | Lee et al. |
| 2020/0328263 A1 | 10/2020 | Choi et al. |

FOREIGN PATENT DOCUMENTS

| | | |
|---|---|---|
| CN | 111223876 A | 6/2020 |
| CN | 112885872 A | 6/2021 |
| CN | 219165069 U | 6/2023 |
| JP | 2011-119238 A | 6/2011 |
| JP | 2019-133959 A | 8/2019 |
| TW | 1715885 B | 1/2021 |

OTHER PUBLICATIONS

English Abstract of CN111223876A, filed on Apr. 27, 2023.
Office Action, Cited References and Search Report dated Jul. 14, 2023 issued by the European Patent Office for the European Counterpart Application No. 23172057.4.
Office Action, Cited References and Search Report dated Jan. 23, 2024 issued by the Taiwan Intellectual Property Office for the Taiwan Counterpart Application No. 112115190.
Office Action, Cited References and Search Report dated Apr. 2, 2024 issued by the Japan Patent Office for the Japan Counterpart Application No. 2023-077296.

* cited by examiner

LIGHT EMITTING ELEMENT AND METHOD FOR MANUFACTURING THE SAME

BACKGROUND OF THE PRESENT DISCLOSURE

Field of the Present Disclosure

The present disclosure relates to a light emitting element, and more particularly to an organic light emitting element.

Description of the Prior Art

Organic light emitting displays are extensively used in high-end electronic devices.

However, due to limitations of existing techniques, the light emitting efficiency and quality of light emitting materials cannot be effectively controlled, such that optical effects of components do not turn out to be those as expected.

SUMMARY OF THE PRESENT DISCLOSURE

In the present disclosure, a light emitting element includes a light emitting array, a plurality of cladding layers and an insulating photosensitive material layer. The light emitting array includes a first organic light emitting unit and a second organic light emitting unit. The first organic light emitting unit includes a first electrode, and the second organic light emitting unit includes a second electrode. The plurality of cladding layers include a first cladding layer and a second cladding layer. The first cladding layer covers a portion of an upper surface of the first electrode and a sidewall of the first electrode, and the second cladding layer covers a portion of an upper surface of the second electrode and a sidewall of the second electrode. The insulating photosensitive material layer is located between the sidewall of the first electrode and the sidewall of the second electrode, and the insulating photosensitive material layer partially covers the upper surface of the first electrode.

In the present disclosure, a light emitting element includes a plurality of organic light emitting units, an insulating photosensitive material layer and a plurality of cladding layers. The insulating photosensitive material layer covers the organic light emitting units and includes a plurality of recesses for exposing a plurality of effective light emitting regions of the organic light emitting units. Each of the cladding layers surrounds a sidewall of each of the light emitting units, and each of the cladding layers is between the sidewalls of two adjacent ones of the organic light emitting units.

In the present disclosure, a method for manufacturing a light emitting element includes: providing a substrate; forming a plurality of electrodes over the substrate; forming a cladding material layer over the electrodes; patterning the cladding material layer to form a plurality of cladding layers surrounding a plurality of sidewalls of the electrodes, and exposing a plurality of upper surfaces of the electrodes, wherein the cladding layers are non-continuous from each other among the electrodes; disposing an insulating photosensitive material over the electrodes and the cladding layers; patterning the insulating photosensitive material to form an insulating photosensitive material layer, which exposes a plurality of effective light emitting regions of the upper surfaces of the electrodes; and disposing an organic light emitting material over the effective light emitting regions of the electrodes.

In some embodiments, an absorption rate (an absorption) of the cladding layers for light is greater than an absorption rate of the insulating photosensitive material layer for the light.

In some embodiments, the cladding layers and the insulating photosensitive material layer are formed integrally and are made of a same material.

In some embodiments, each cladding layer includes a conductor, and the plurality of cladding layers are separated from each other.

In some embodiments, each cladding layer includes metal, resin, graphite or any combination of the above.

In some embodiments, each cladding layer includes a photosensitive material.

In some embodiments, the light emitting element further includes a transparent substrate, wherein the organic light emitting units are disposed over the transparent substrate.

In some embodiments, the first electrode has a first edge and a second edge opposite to or adjacent to the first edge, a portion of the upper surface extends inward from the first edge by a first distance, a portion of the upper surface extends inward from the second edge by a second distance, and the first distance is greater than the second distance.

In some embodiments, the first electrode has a first edge and a second edge opposite to or adjacent to the first edge, the insulating photosensitive material layer is in contact with a first region and a second region of the upper surface of the first electrode, the first region is adjacent to the first edge and the second region is adjacent to the second edge, the width of the first region is not equal to the width of the second region, and/or the area of the first region is not equal to the area of the second region.

In some embodiments, the first electrode and the second electrode are anodes, and/or the first electrode and the second electrode include a transparent conductive material.

In some embodiments, the first organic light emitting unit and the second organic light emitting unit emit light having a same wavelength.

In some embodiments, the organic light emitting material includes an electron transport layer (ETL), an electron injection layer (EIL), a emitting layer (EM), a hole blocking layer (HBL), a hole injection layer (HIL), a hole transport layer (HTL) or any combination of the above.

In some embodiments, the cladding material layer is formed by a spin coating process or a deposition process. In some embodiments, the cladding material layer is patterned by a photolithography process.

DETAILED DESCRIPTION OF THE EMBODIMENTS

Figure 1:
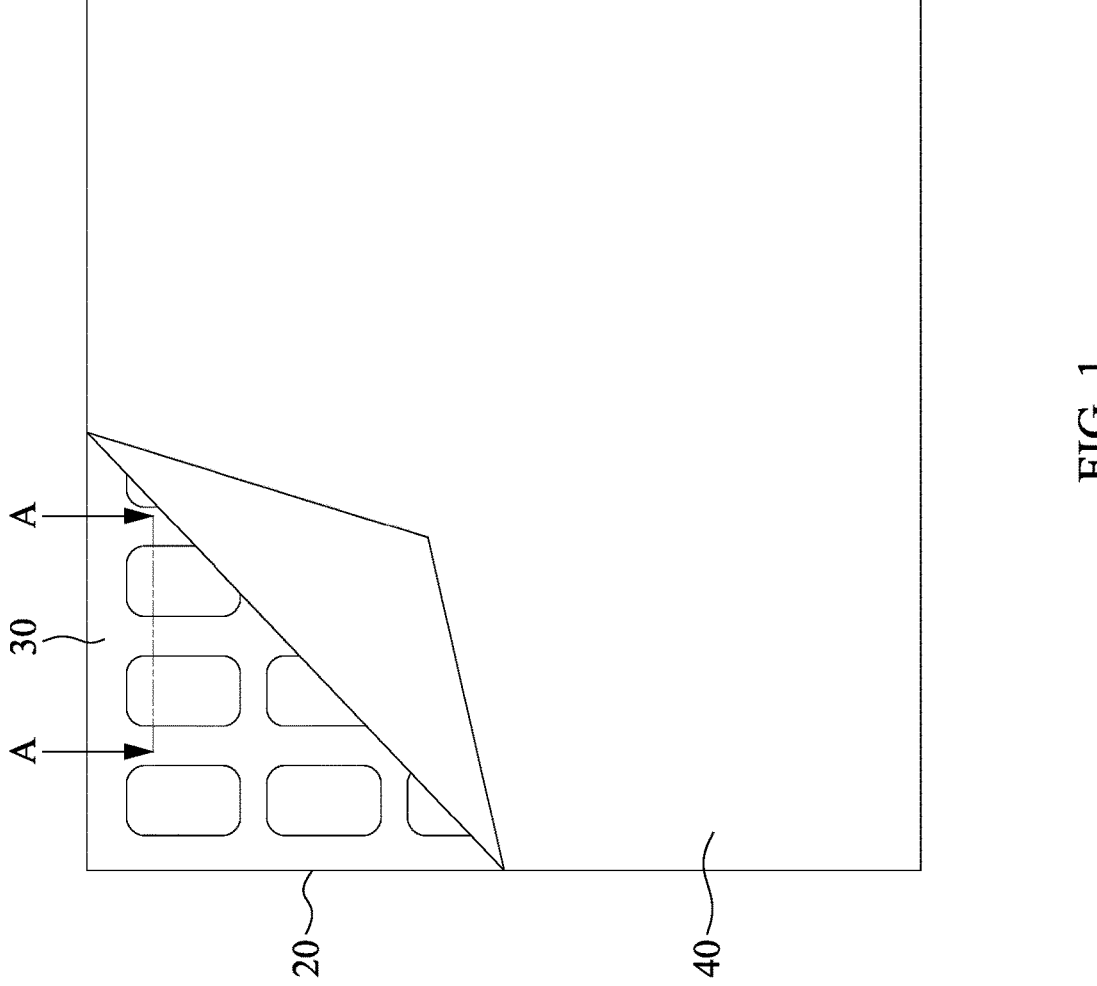
FIG. 1 is a top view of an exemplary intermediate product of a light emitting element.

FIG. 1 is a top view of an exemplary intermediate product of a light emitting element 10. The light emitting element 10 includes a light emitting layer 20 and a cover layer 40 located over the light emitting layer 20. For the light emitting layer 20, a spacer 30 may be designed to provide a recess array used to accommodate a light emitting pixel array. In some embodiments, the spacer 30 may include a photosensitive material.

Figure 2A:
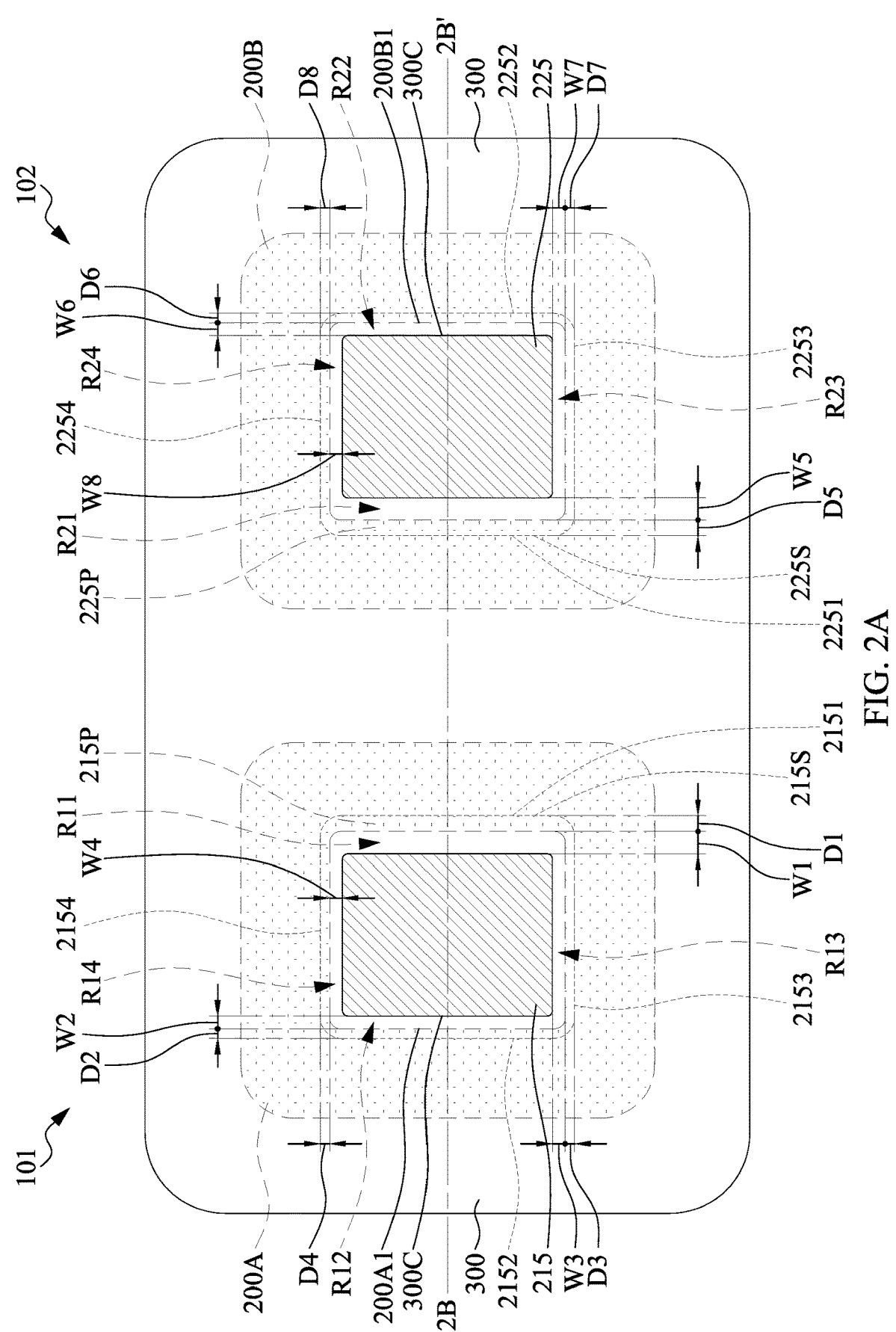
FIG. 2A is a top view of a light emitting element according to some embodiments.
Figure 2B:
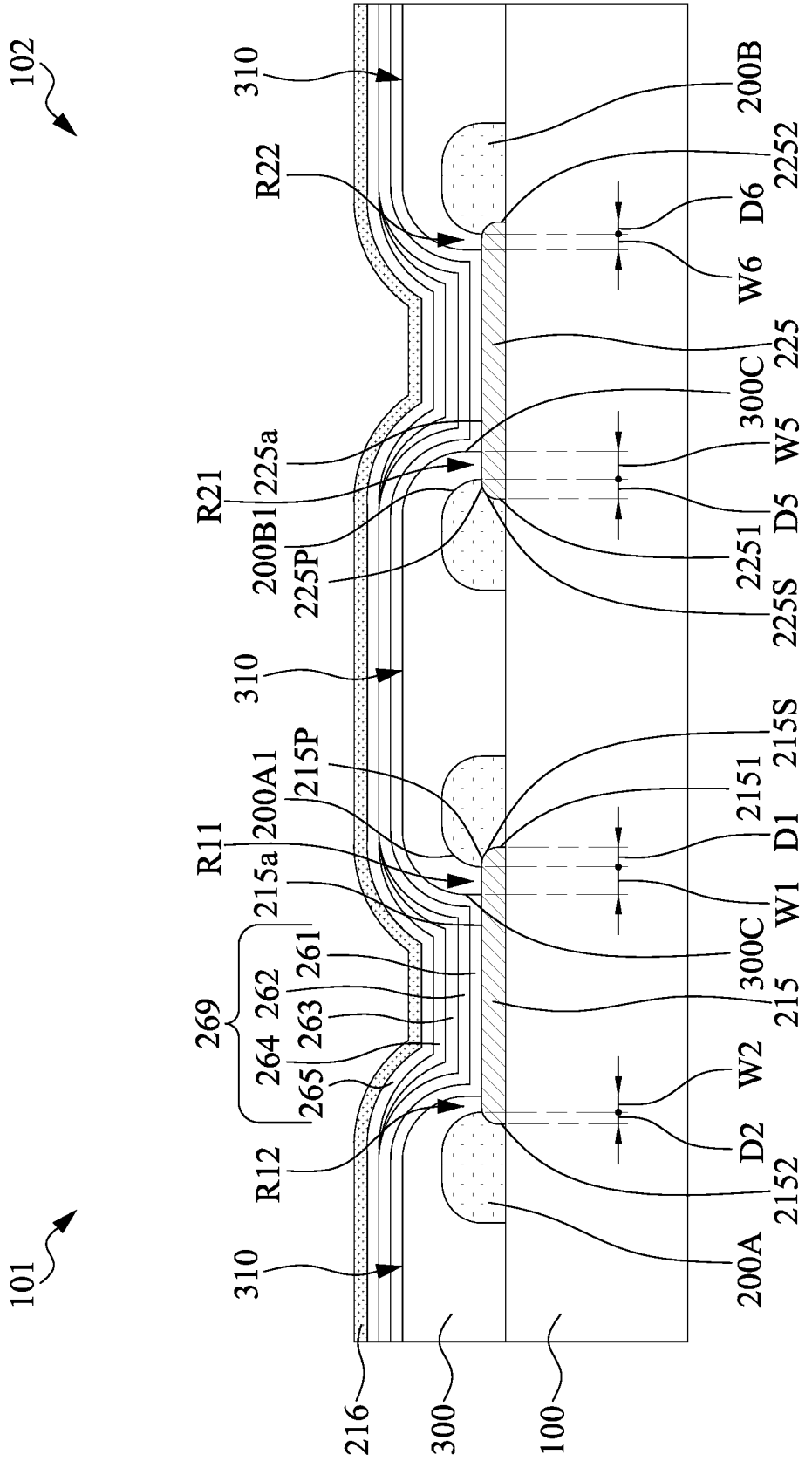
FIG. 2B is a section diagram along the line 2B-2B' in FIG. 2A as an example.

FIG. 2A shows a top view of a light emitting element according to some embodiments, and FIG. 2B shows a section diagram along the line 2B-2B' in FIG. 2A as an example. In some embodiments, FIG. 2B is a section diagram along the line A-A in FIG. 1, and is used to merely illustrate a light emitting region. In some embodiments, FIG. 2B is a section diagram along the line 2B-2B' in FIG. 2A as an example, and only a light emitting region is illustrated. For brevity and clarity, the cover layer 40 is omitted. The spacer 30 includes a plurality of protrusions 310 to define a light emitting pixel pattern. The recess is located between two adjacent protrusions 310 and provides a space for accommodating light emitting pixels. Observing from the section diagram of FIG. 2, a person skilled in the art would be able to understand that the protrusions 310 are depicted in a disconnected manner. However, observing from the schematic top views of FIG. 1 and FIG. 2A, the protrusions 310 can be connected to each other by other parts of the spacer 30.

In some embodiments, as shown in FIG. 1, FIG. 2A and FIG. 2B, the light emitting element 10 includes a substrate 100, the protrusions 310 over the substrate 100, and a light emitting array. In some embodiments, the light emitting array includes a plurality of organic light emitting units (or referred to as light emitting pixels), for example, including at least an organic light emitting unit 101 (or referred to as a first organic light emitting unit) and an organic light emitting unit 102 (or referred to as a second organic light emitting unit). In some embodiments, the organic light emitting unit 101 and the organic light emitting unit 102 are between the protrusions 310 and over the substrate 100. In some embodiments, the organic light emitting unit 101 and the organic light emitting unit 102 emit light having the same wavelength.

In some embodiments, the substrate 100 may include a thin-film transistor (TFT) array, which is configured to correspond to the light emitting pixels in the light emitting layer 20. The substrate 100 may include several capacitors. In some embodiments, more than one transistor is configured to form a circuit with one capacitor and one light emitting pixel.

In some embodiments, the organic light emitting unit 101 includes an electrode 215 (or referred to as a first electrode), an organic layer 269 (or referred to as a light emitting layer), and an electrode 216 (or referred to as a second electrode) over the organic layer 269. The organic light emitting unit 102 includes an electrode 225 (or referred to as a first electrode), an organic layer 269, and an electrode 216 (or referred to as a second electrode) over the organic layer 269. In some embodiments, the electrode 216 is located over the organic layer 269.

In some embodiments, the electrodes 215 of the organic light emitting unit 101 and the electrode 225 of the organic light emitting unit 102 are anodes. In some embodiments, the electrodes 215 of the organic light emitting unit 101 and the electrode 225 of the organic light emitting unit 102 include a transparent conductive material. In some embodiments, the electrode 215 and the electrode 225 are arranged to have one side be connected to a circuit embedded into the substrate 100 and the other side be in contact with the organic layer 269.

In some embodiments, the second electrode 216 is patterned to cover only effective light emitting regions of the individual organic light emitting units. In some embodiments, the second electrode 216 is in contact with the organic layer 269. The second electrode 216 may be a continuous film as shown in FIG. 2B and be located over the organic layer 269 and the protrusions 310. In other words, the second electrode 216 is a common electrode of several organic light emitting units. In some embodiments, the second electrode 216 is a common electrode of all organic light emitting units of the light emitting elements of the second electrode 216.

In some embodiments, the organic layer 269 includes one or more layers of organic light emitting material. The organic light emitting material includes an electron transport layer (ETL), an electron injection layer (EIL), a emitting layer (EM), a hole blocking layer (HBL), a hole injection layer (HIL), a hole transport layer (HTL) or any combination of the above.

In some embodiments, the organic layer 269 includes a first carrier transport layer 262 over the protrusions 310 and the electrode 215, a second carrier transport layer 263 over the first carrier transport layer 262, and an organic emitting layer 264 over the second carrier transport layer 263. In some embodiments, the organic layer 269 further includes a carrier injection layer 261 arranged between the electrode 215 and the first carrier transport layer 262. In some embodiments, the organic layer 269 further includes an organic carrier transport layer 265 arranged over the organic emitting layer 264. In some embodiments, the carrier injection layer 261 may be a hole injection layer, the first carrier transport layer 262 may be a first hole transport layer, the second carrier transport layer 263 may be a second hole transport layer, and the organic carrier transport layer 265 may be an electron transport layer.

In some embodiments, the protrusions 310 include a portion of a cladding layer 200A and a portion of the insulating photosensitive material layer 300. In some embodiments, the protrusions 310 include a portion of a cladding layer 200B and a portion of the insulating photosensitive material layer 300. In some embodiments, the protrusions 310 include a portion of the cladding layer 200A, a portion of a cladding layer 200B, and a portion of the insulating photosensitive material layer 300. In some embodiments, the protrusions 310 are referred to as a pixel defined layer (PDL).

In some embodiments, the cladding layer 200A surrounds a sidewall of the organic light emitting unit 101. In some embodiments, the cladding layer 200A covers a portion 215P of an upper surface 215a of the electrode 215 and a sidewall 215S of the electrode 215. In some embodiments, the cladding layer 200A includes a through hole 200A1 for partially exposing the upper surface 215a of the electrode 215. In some embodiments, the cladding layer 200A is between the sidewall of the organic light emitting unit 101 and the sidewall of the adjacent organic light emitting unit 102.

In some embodiments, the cladding layer 200B surrounds the sidewall of the organic light emitting unit 102. In some embodiments, the cladding layer 200B covers a portion 225P of an upper surface 225a of the electrode 225 and a sidewall 225S of the electrode 225. In some embodiments, the cladding layer 200B includes a through hole 200B1 for partially exposing the upper surface 225a of the electrode 225. In some embodiments, the cladding layer 200B is between the sidewall of the organic light emitting unit 101 and the sidewall of the adjacent organic light emitting unit 102.

In some embodiments, the cladding layers 200A and 200B include conductors, and the cladding layers 200A and 200B are separated from each other. In some embodiments, the cladding layers 200A and 200B include metal, resin, graphite or any combination of the above. In some embodiments, the cladding layers 200A and 200B include a photosensitive material. In some embodiments, the cladding layers 200A and 200B include quantum dots, which have excellent light absorption performance. In some embodiments, the cladding layers 200A and 200B include a carbon black material, for example, carbon black nanoparticles, conductive fibers containing carbon black, or the like. In some embodiments, the cladding layers 200A and 200B include black materials, which have an absorption rate of 90%, 95%, 99%, 99.5% or above 99.9% for visible light.

In some embodiments, the cladding layers 200A and 200B have an absorption rate of greater than or equal to 50% for a specific wavelength. In some embodiments, the cladding layers 200A and 200B have an absorption rate of greater than or equal to 60% for a specific wavelength. In some embodiments, the cladding layers 200A and 200B have an absorption rate of greater than or equal to 70% for a specific wavelength. In some embodiments, the cladding layers 200A and 200B have an absorption rate of greater than or equal to 80% for a specific wavelength. In some embodiments, the cladding layers 200A and 200B have an absorption rate of greater than or equal to 90% for a specific wavelength. In some embodiments, the cladding layers 200A and 200B have an absorption rate of greater than or equal to 95% for a specific wavelength. In some embodiments, the cladding layers 200A and 200B have an absorption rate of greater than or equal to 99% for a specific wavelength. In some embodiments, the cladding layers 200A and 200B have an absorption rate of greater than or equal to 99.5% for a specific wavelength. In some embodiments, the cladding layers 200A and 200B have an absorption rate of greater than or equal to 99.9% for a specific wavelength. In some embodiments, the specific wavelength is not greater than 400 nm. In some embodiments, the specific wavelength is not greater than 350 nm. In some embodiments, the specific wavelength is not greater than 300 nm. In some embodiments, the specific wavelength is not greater than 250 nm. In some embodiments, the specific wavelength is not greater than 200 nm. In some embodiments, the specific wavelength is not greater than 150 nm. In some embodiments, the specific wavelength is not greater than 100 nm.

In some embodiments, the electrode 215 has an edge 2151 and an edge 2152 opposite to the edge 2151, the portion 215P of the upper surface 215a of the electrode 215 extends inward from the edge 2151 by a distance D1, the portion 215P of the upper surface 215a of the electrode 215 extends inward from the edge 2152 by a distance D2, and the distance D1 is greater than the distance D2. In some embodiments, the electrode 215 has an edge 2153 adjacent to the edge 2151, the portion 215P of the upper surface 215a of the electrode 215 extends inward from the edge 2153 by a distance D3, and the distance D1 is greater than the distance D3. In some embodiments, the electrode 215 has an edge 2154 adjacent to the edge 2151, the portion 215P of the upper surface 215a of the electrode 215 extends inward from the edge 2154 by a distance D4, and the distance D1 is greater than the distance D4. In some embodiments, the distance D1, the distance D2, the distance D3 and the distance D4 may all be different. In some embodiments, at least two of the distance D1, the distance D2, the distance D3 and the distance D4 are the same.

In some embodiments, the electrode 225 has an edge 2251 and an edge 2252 opposite to the edge 2251, the portion 225P of the upper surface 225a of the electrode 225 extends inward from the edge 2251 by a distance D5, the portion 225P of the upper surface 225a of the electrode 225 extends inward from the edge 2252 by a distance D6, and the distance D5 is greater than the distance D6. In some embodiments, the electrode 225 has an edge 2253 adjacent to the edge 2251, the portion 225P of the upper surface 225a of the electrode 225 extends inward from the edge 2253 by a distance D7, and the distance D5 is greater than the distance D7. In some embodiments, the electrode 225 has an edge 2254 adjacent to the edge 2251, the portion 225P of the upper surface 225a of the electrode 225 extends inward from the edge 2254 by a distance D8, and the distance D5 is greater than the distance D8. In some embodiments, the distance D5, the distance D6, the distance D7 and the distance D8 may all be different. In some embodiments, at least two of the distance D5, the distance D6, the distance D7 and the distance D8 are the same.

In some embodiments, the insulating photosensitive material layer 300 is located between the sidewall 215S of the electrode 215 and the sidewall 225S of the electrode 225. In some embodiments, the insulating photosensitive material layer 300 partially covers the upper surface 215a of the electrode 215. In some embodiments, the insulating photosensitive material layer 300 partially covers the upper surface 225a of the electrode 225. In some embodiments, the insulating photosensitive material layer 300 covers the organic light emitting unit 101 and the organic light emitting unit 102, and the insulating photosensitive material layer 300 includes a plurality of recesses 300C, which are for exposing a plurality of effective light emitting regions of a plurality of organic light emitting units, for example, an effective light emitting region of the organic light emitting unit 101 and an effective light emitting region of the organic light emitting unit 102.

In some embodiments, the cladding layers 200A and 200B are located under the insulating photosensitive material layer 300. In some embodiments, the cladding layers 200A and 200B are embedded into the insulating photosensitive material layer 300. In some embodiments, the cladding layer 200A is located between a peripheral region (the portion 215P and the sidewall 215S) of the upper surface 215a of the electrode 215 and the insulating photosensitive material layer 300. In some embodiments, the cladding layer 200B is located between a peripheral region (the portion 225P and the sidewall 225S) of the upper surface 225a of the electrode 225 and the insulating photosensitive material layer 300.

In some embodiments, the center of the electrode 215 and the center of the recess 300C over the electrode 215 are not aligned. In some embodiments, the center of the electrode 215 and the center of the through hole 200A1 of the cladding layer 200A are not aligned. In some embodiments, the center of the electrode 225 and the center of the recess 300C over the electrode 225 are not aligned. In some embodiments, the center of the electrode 225 and the center of the through hole 200B 1 of the cladding layer 200B are not aligned.

In some embodiments, the insulating photosensitive material layer 300 has an absorption rate of greater than or equal to 50% for a specific wavelength. In some embodiments, the insulating photosensitive material layer 300 has an absorption rate of greater than or equal to 60% for a specific wavelength. In some embodiments, the insulating photosensitive material layer 300 has an absorption rate of greater than or equal to 70% for a specific wavelength. In some embodiments, the insulating photosensitive material layer 300 has an absorption rate of greater than or equal to 80% for a specific wavelength. In some embodiments, the insulating photosensitive material layer 300 has an absorption rate of greater than or equal to 90% for a specific wavelength. In some embodiments, the insulating photosensitive material layer 300 has an absorption rate of greater than or equal to 95% for a specific wavelength. In some embodiments, the specific wavelength is not greater than 400 nm. In some embodiments, the specific wavelength is not greater than 350 nm. In some embodiments, the specific wavelength is not greater than 300 nm. In some embodiments, the specific wavelength is not greater than 250 nm. In some embodiments, the specific wavelength is not greater than 200 nm. In some embodiments, the specific wavelength is not greater than 150 nm. In some embodiments, the specific wavelength is not greater than 100 nm. In some embodiments, the absorption rates of the cladding layers 200A and 200B for light having a specific wavelength are greater than the absorption rate of the insulating photosensitive material layer 300 for light having the specific wavelength.

In some embodiments, the insulating photosensitive material layer 300 is in contact with a region R11 of the upper surface 215a of the electrode 215 near the edge 2151, the insulating photosensitive material layer 300 is in contact with a region R12 of the upper surface 215a of the electrode 215 near the edge 2152, and a width W1 of the region R11 is not equal to a width W2 of the region R12. In some embodiments, the area of the region R11 is not equal to the area of the region R12. In some embodiments, the insulating photosensitive material layer 300 is in contact with a region R13 of the upper surface 215a of the electrode 215 near the edge 2153, and the width W1 of the region R11 is not equal to a width W3 of the region R13. In some embodiments, the area of the region R11 is not equal to the area of the region R13. In some embodiments, the insulating photosensitive material layer 300 is in contact with a region R14 of the upper surface 215a of the electrode 215 near the edge 2154, and the width W1 of the region R11 is not equal to a width W4 of the region R14. In some embodiments, the area of the region R11 is not equal to the area of the region R14. In some embodiments, the region R11, the region R12, the region R13 and the region R14 of the upper surface 215a of the electrode 215 surround the effective light emitting region of the upper surface 215a of the electrode 215. In some embodiments, the portion 215P of the upper surface 215a of the electrode 215 surrounds the region R11, the region R12, the region R13 and the region R14. In some embodiments, a portion of the insulating photosensitive material layer 300 surrounds the effective light emitting region of the upper surface 215a of the electrode 215. In some embodiments, a portion of the insulating photosensitive material layer 300 is in contact with an annular region between the effective light emitting region and the portion 215P of the upper surface 215a of the electrode 215 (that is, the region R11, the region R12, the region R13 and the region R14).

In some embodiments, the insulating photosensitive material layer 300 is in contact with a region R21 of the upper surface 225a of the electrode 225 near the edge 2251, the insulating photosensitive material layer 300 is in contact with a region R22 of the upper surface 225a of the electrode 225 near the edge 2252, and a width W5 of the region R21 is not equal to a width W6 of the region R22. In some embodiments, the area of the region R21 is not equal to the area of the region R22. In some embodiments, the insulating photosensitive material layer 300 is in contact with a region R23 of the upper surface 225a of the electrode 225 near the edge 2253, and the width W5 of the region R21 is not equal to a width W7 of the region R23. In some embodiments, the area of the region R21 is not equal to the area of the region R23. In some embodiments, the insulating photosensitive material layer 300 is in contact with a region R24 of the upper surface 225a of the electrode 225 near the edge 2254, and the width W5 of the region R21 is not equal to a width W8 of the region R24. In some embodiments, the area of the region R21 is not equal to the area of the region R24. In some embodiments, the region R21, the region R22, the region R23 and the region R24 of the upper surface 225a of the electrode 225 surround the effective light emitting region of the upper surface 225a of the electrode 225. In some embodiments, the portion 225P of the upper surface 225a of the electrode 225 surrounds the region R21, the region R22, the region R23 and the region R24. In some embodiments, a portion of the insulating photosensitive material layer 300 surrounds the effective light emitting region of the upper surface 225a of the electrode 225. In some embodiments, a portion of the insulating photosensitive material layer 300 is in contact with an annular region between the effective light emitting region and the portion 225P of the upper surface 225a of the electrode 225 (that is, the region R21, the region R22, the region R23 and the region R24).

According to some embodiments of the present disclosure, in a light emitting element, a plurality of cladding layers cover sidewalls of a plurality of organic light emitting units (for example, sidewalls of a plurality of electrodes), and an insulating photosensitive layer is configured to function cooperatively. Thus, optical crosstalk among the organic light emitting units can be effectively reduced, the halo problem of a light emitting pattern can be alleviated, and the contrast of a light emitting pattern can be enhanced.

Moreover, according to some embodiments of the present disclosure, each cladding layer covers the sidewall and a periphery of an upper surface of an electrode (or anode) of each organic light emitting unit, and the insulating photosensitive material layer is further arranged between the sidewalls of the electrodes of the adjacent light emitting units, such that the light from the electrode reflected upward or obliquely can be absorbed effectively by the cladding layer. Thus, optical crosstalk of reflected light of an adjacent electrode can be better reduced, and the contrast of the light emitting pattern can be effectively enhanced. In addition, apart from assisting in absorbing the light from the electrode reflected upward or obliquely, when the material of the cladding layer includes a conductor, the insulating photosensitive material layer further achieves an effect of electrical isolation among different organic light emitting units, hence preventing short-circuitry generated by the conductive cladding layer contacting an adjacent organic light emitting unit.

Moreover, according to some embodiments of the present disclosure, each cladding layer is embedded into the insulating photosensitive material layer, located below the insulating photosensitive material layer, and/or located between the peripheral region of each electrode and the insulating photosensitive material layer. Thus, the light absorption effect for the light of the electrode reflected upward or obliquely can be reinforced, further better effectively reducing optical crosstalk among organic light emitting units and alleviating the halo problem of a light emitting pattern, as well as enhancing the contrast of the light emitting pattern.

Further, according to some embodiments of the present disclosure, a plurality of organic light emitting units may emit light having the same wavelength. For example, a plurality of adjacent organic light emitting units may emit light having the same wavelength, and the sidewall of each organic light emitting unit is covered by the respective corresponding cladding layer. Thus, by designing the number of the plurality of organic light emitting units, position configuration relations and profiles of individual effective light emitting regions, a light emitting pattern having a fine pattern design and high contrast can be implemented.

Figure 3A:
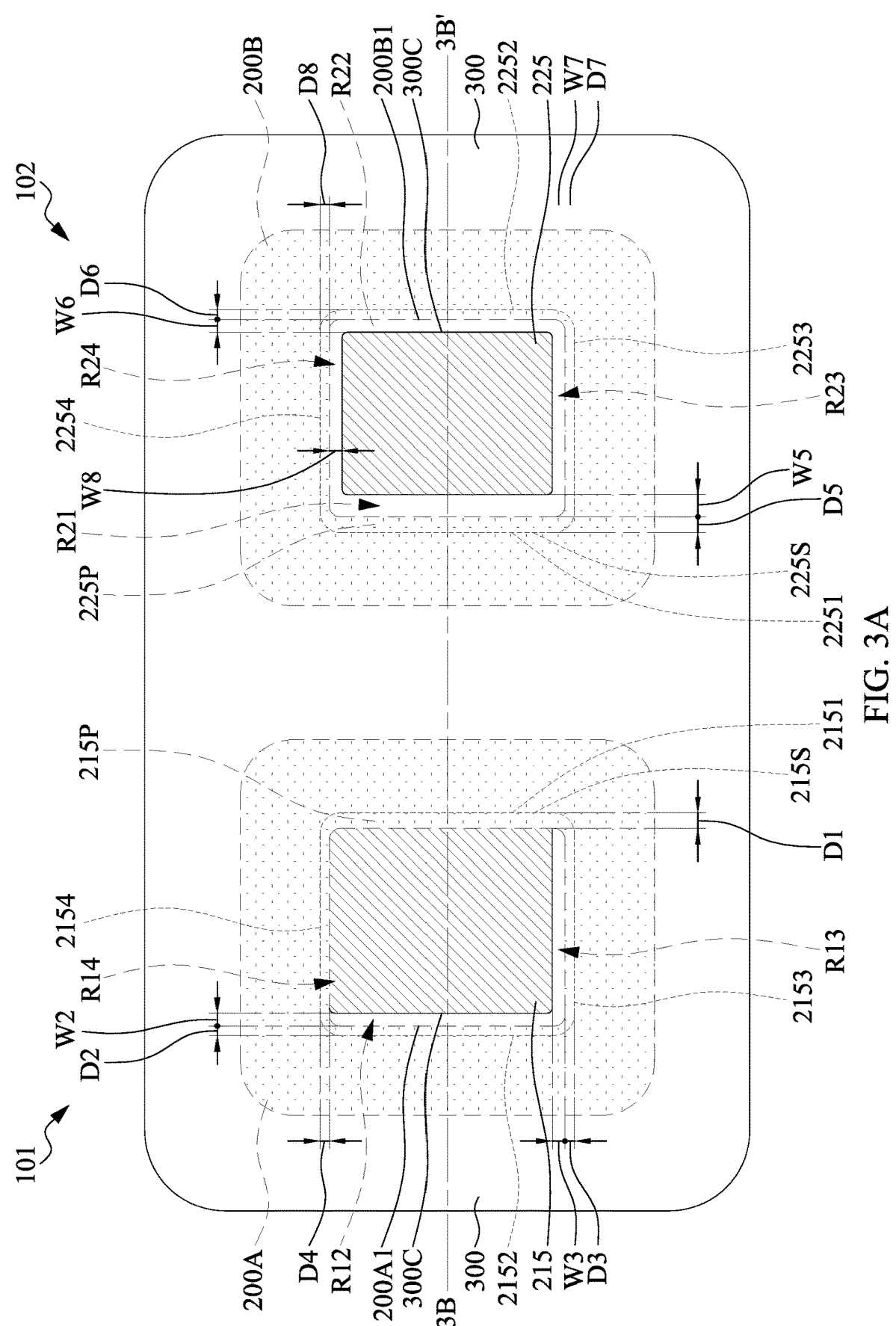
FIG. 3A is a top view of a light emitting element according to some embodiments.
Figure 3B:
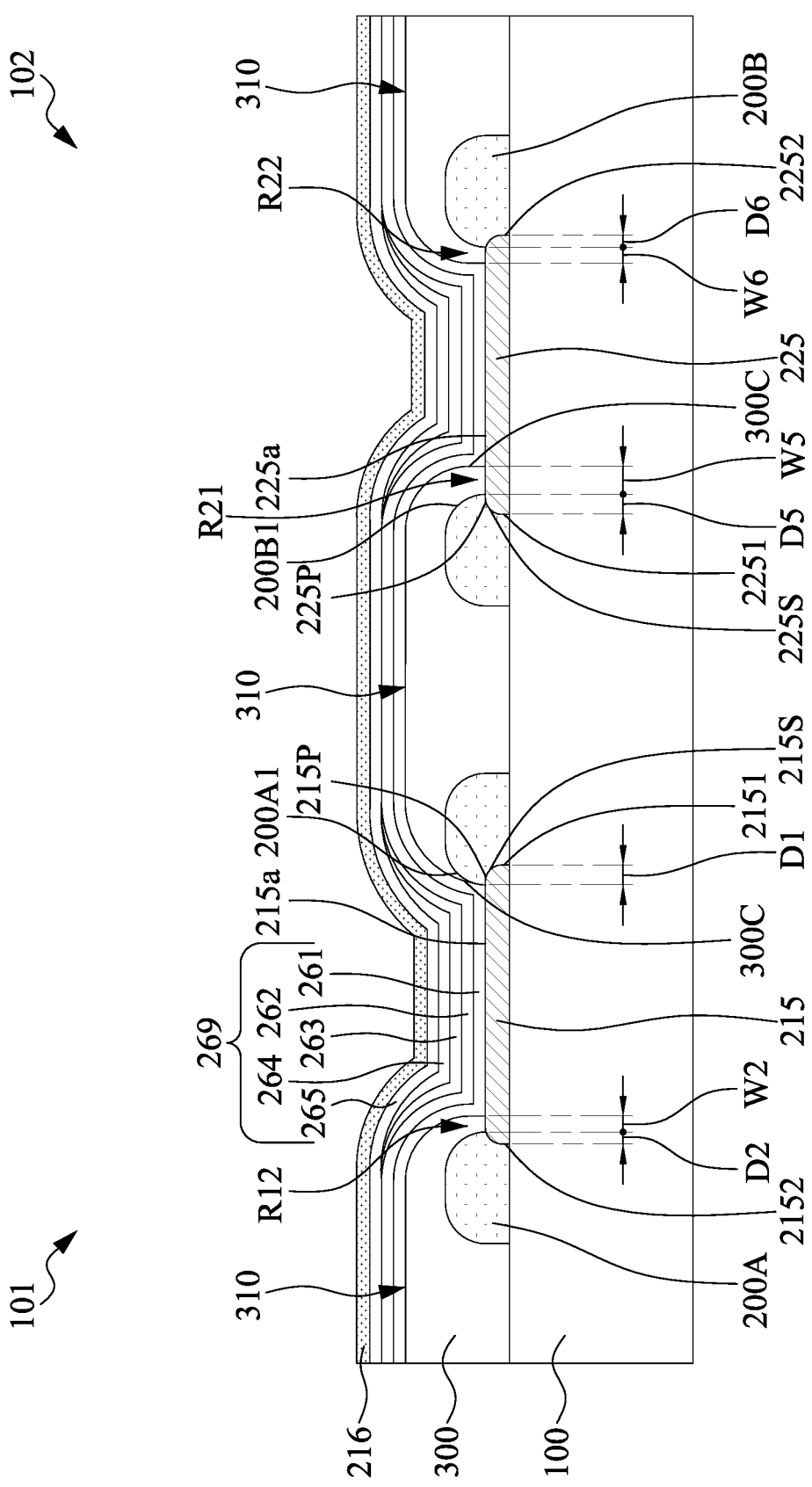
FIG. 3B is a section diagram along the line 3B-3B' in FIG. 3A as an example.

FIG. 3A shows a top view of a light emitting element according to some embodiments, and FIG. 3B shows a section diagram along the line 3B-3B' in FIG. 3A. In some embodiments, FIG. 3B is a section diagram along the line A-A in FIG. 1 as an example, and only a light emitting region is illustrated. In some embodiments, FIG. 3B is a section diagram along the line 3B-3B' in FIG. 3A as an example, and only a light emitting region is illustrated. For brevity and clarity, the cover layer 40 is omitted.

In some embodiments, as shown in FIG. 3A and FIG. 3B, a portion of the cladding layer 200A is in direct contact with a portion of the organic layer 269. In some embodiments, the upper surface 215a of the electrode 215 does not include the region R11 or the region R14. In some embodiments, a portion of the insulating photosensitive material layer 300 is in contact with the upper surface 215a of the electrode 215 and is located between the effective light emitting region and the portion 215P. In some embodiments, a portion of the insulating photosensitive material layer 300 is in contact with an L-shaped region between the effective light emitting region and the portion 215P of the upper surface 215a of the electrode 215 (that is, the region R11 and the region R14).

Figure 4A:
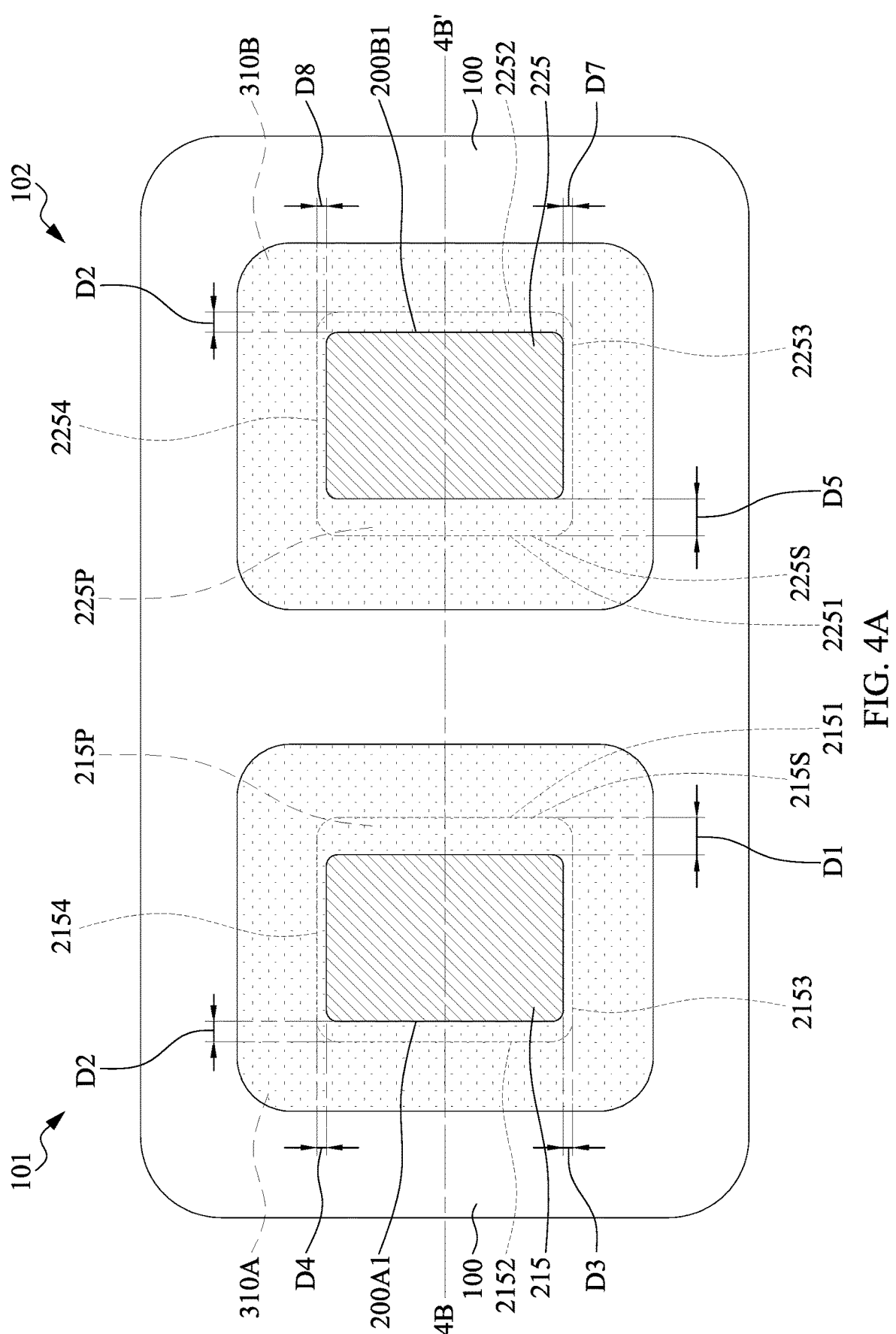
FIG. 4A is a top view of a light emitting element according to some embodiments.
Figure 4B:
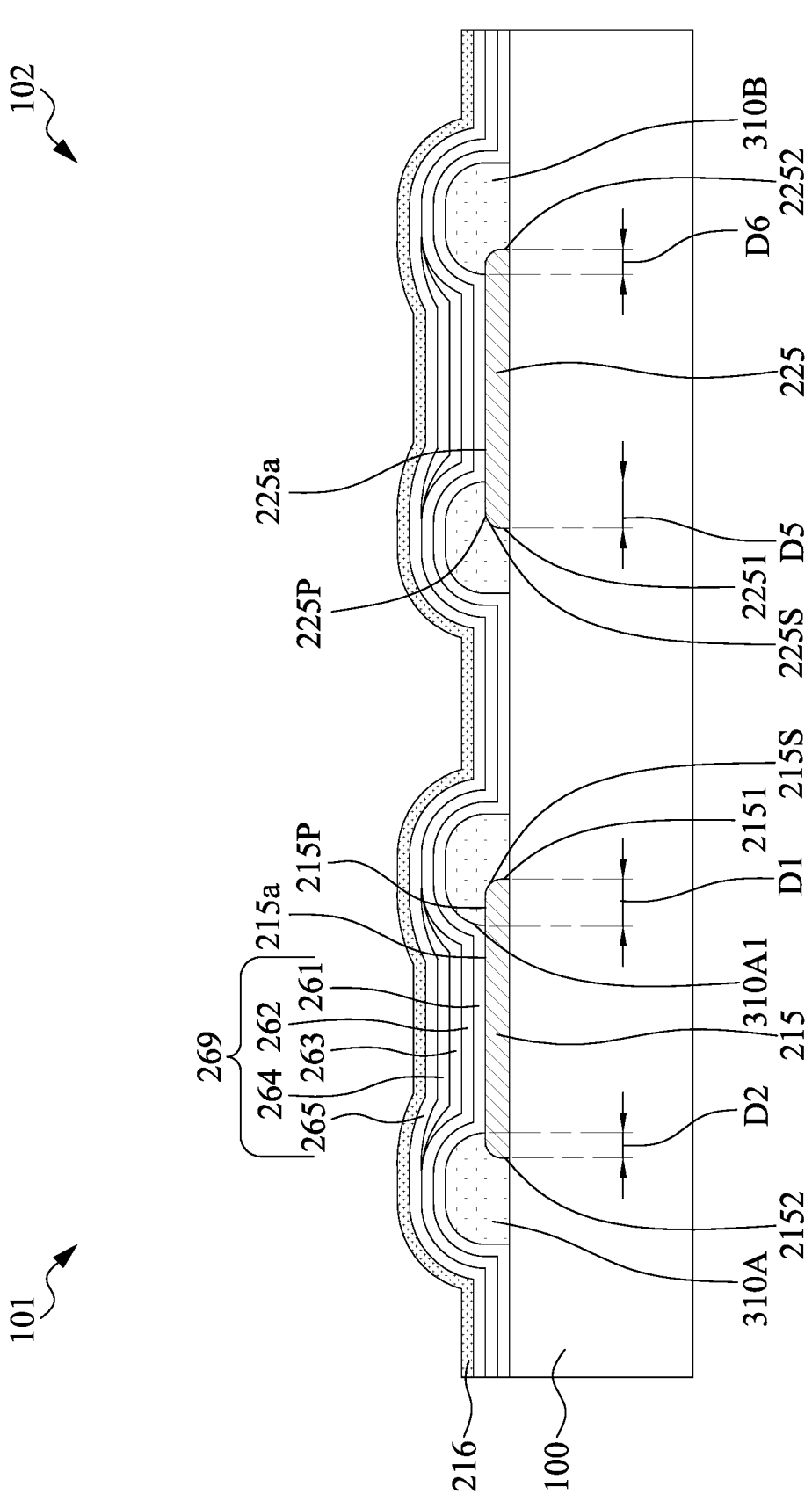
FIG. 4B is a section diagram along the line 4B-4B' in FIG. 4A as an example.

FIG. 4A shows a top view of a light emitting element according to some embodiments, and FIG. 4B shows a section diagram along the line 4B-4B' in FIG. 4A. In some embodiments, FIG. 4B is a section diagram along the line A-A in FIG. 1 as an example, and only a light emitting region is illustrated. In some embodiments, FIG. 4B is a section diagram along the line 4B-4B' in FIG. 4A as an example, and only a light emitting region is illustrated. For brevity and clarity, the cover layer 40 is omitted.

In some embodiments, the cladding layer and the insulating photosensitive material layer are formed as an integral (or integrally) and are made of the same material. In some embodiments, as shown in FIG. 4A and FIG. 4B, a cladding layer (for example, the cladding layer 200A) and an insulating photosensitive material layer (for example, the insulating photosensitive material layer 300) are formed as an integral and a protrusions 310A is made of the same material, and a cladding layer (for example, the cladding layer 200B) and an insulating photosensitive material layer (for example, the insulating photosensitive material layer 300) are formed as an integral and the protrusion 310B is made of the same material.

In some embodiments, the protrusion 310A surrounds the sidewall of the organic light emitting unit 101. In some embodiments, the protrusion 310A covers the portion 215P of the upper surface 215a of the electrode 215 and the sidewall 215S of the electrode 215. In some embodiments, the protrusion 310A includes a through hole 310A1 (or referred to as a recess) for partially exposing the upper surface 215a of the electrode 215. In some embodiments, the protrusion 310A is between the sidewall of the organic light emitting unit 101 and the sidewall of the adjacent organic light emitting unit 102.

In some embodiments, the protrusion 310B surrounds the sidewall of the organic light emitting unit 102. In some embodiments, the protrusion 310B covers the portion 225P of the upper surface 225a of the electrode 225 and the sidewall 225S of the electrode 225. In some embodiments, the protrusion 310B includes a through hole 310B1 (or referred to as a recess) for partially exposing the upper surface 225a of the electrode 225. In some embodiments, the protrusion 310B is between the sidewall of the organic light emitting unit 101 and the sidewall of the adjacent organic light emitting unit 102.

In some embodiments, the protrusions 310A and 310B include conductors, and the protrusions 310A and 310B are separated from each other.

In some embodiments, the protrusions 310A and 310B have an absorption rate of greater than or equal to 80% for a specific wavelength. In some embodiments, the protrusions 310A and 310B have an absorption rate of greater than or equal to 90% for a specific wavelength. In some embodiments, the protrusions 310A and 310B have an absorption rate of greater than or equal to 95% for a specific wavelength. In some embodiments, the protrusions 310A and 310B have an absorption rate of greater than or equal to 99% for a specific wavelength. In some embodiments, the protrusions 310A and 310B have an absorption rate of greater than or equal to 99.5% for a specific wavelength. In some embodiments, the protrusions 310A and 310B have an absorption rate of greater than or equal to 99.9% for a specific wavelength. In some embodiments, the specific wavelength is not greater than 400 nm. In some embodiments, the specific wavelength is not greater than 350 nm. In some embodiments, the specific wavelength is not greater than 300 nm. In some embodiments, the specific wavelength is not greater than 250 nm. In some embodiments, the specific wavelength is not greater than 200 nm. In some embodiments, the specific wavelength is not greater than 150 nm. In some embodiments, the specific wavelength is not greater than 100 nm.

In some embodiments, the center of the electrode 215 and the center of the through hole 310A1 of the protrusion 310A are not aligned. In some embodiments, the center of the electrode 225 and the center of the through hole 310B 1 of the protrusion 310B are not aligned.

Figure 4C:
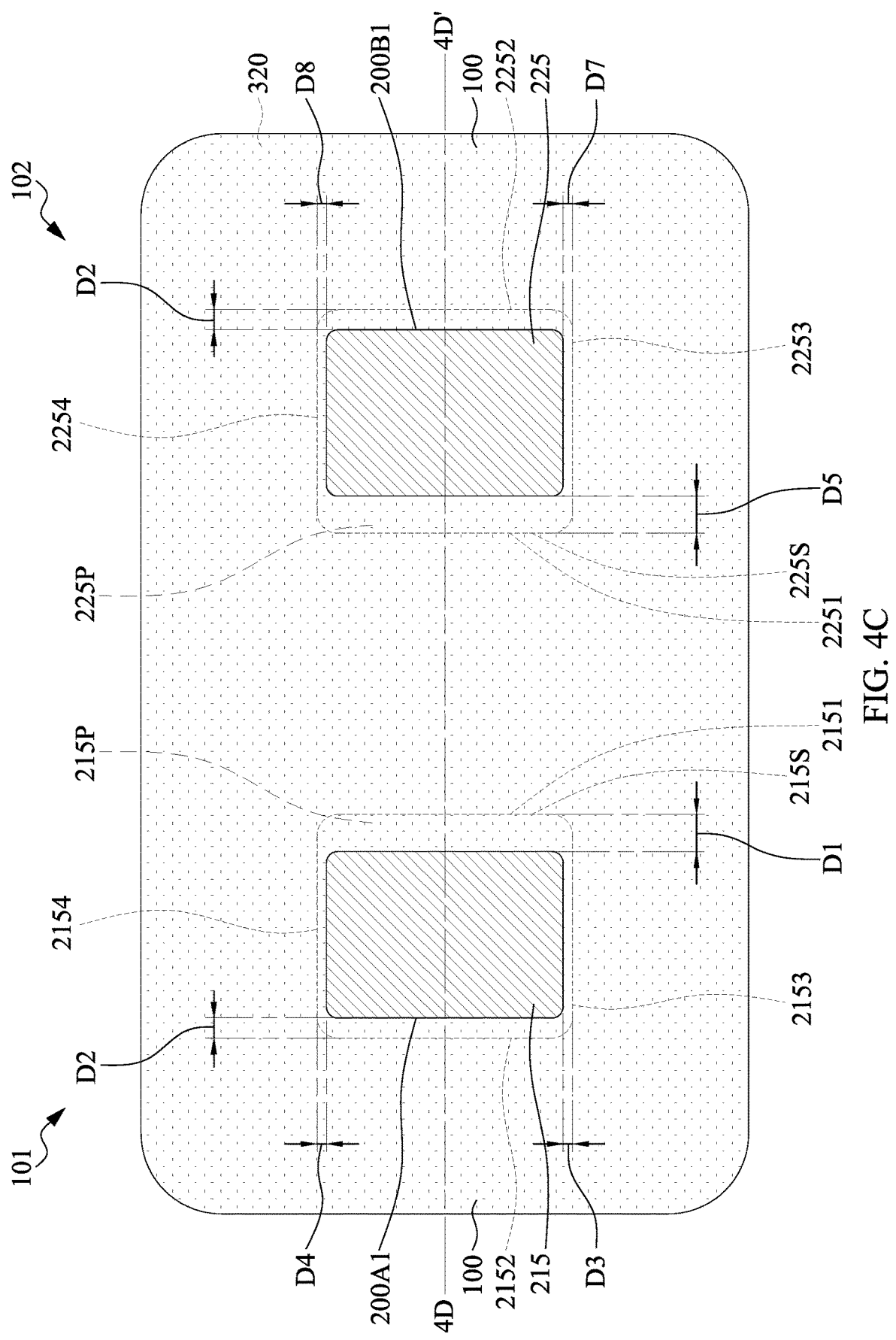
FIG. 4C is a top view of a light emitting element according to some embodiments.
Figure 4D:
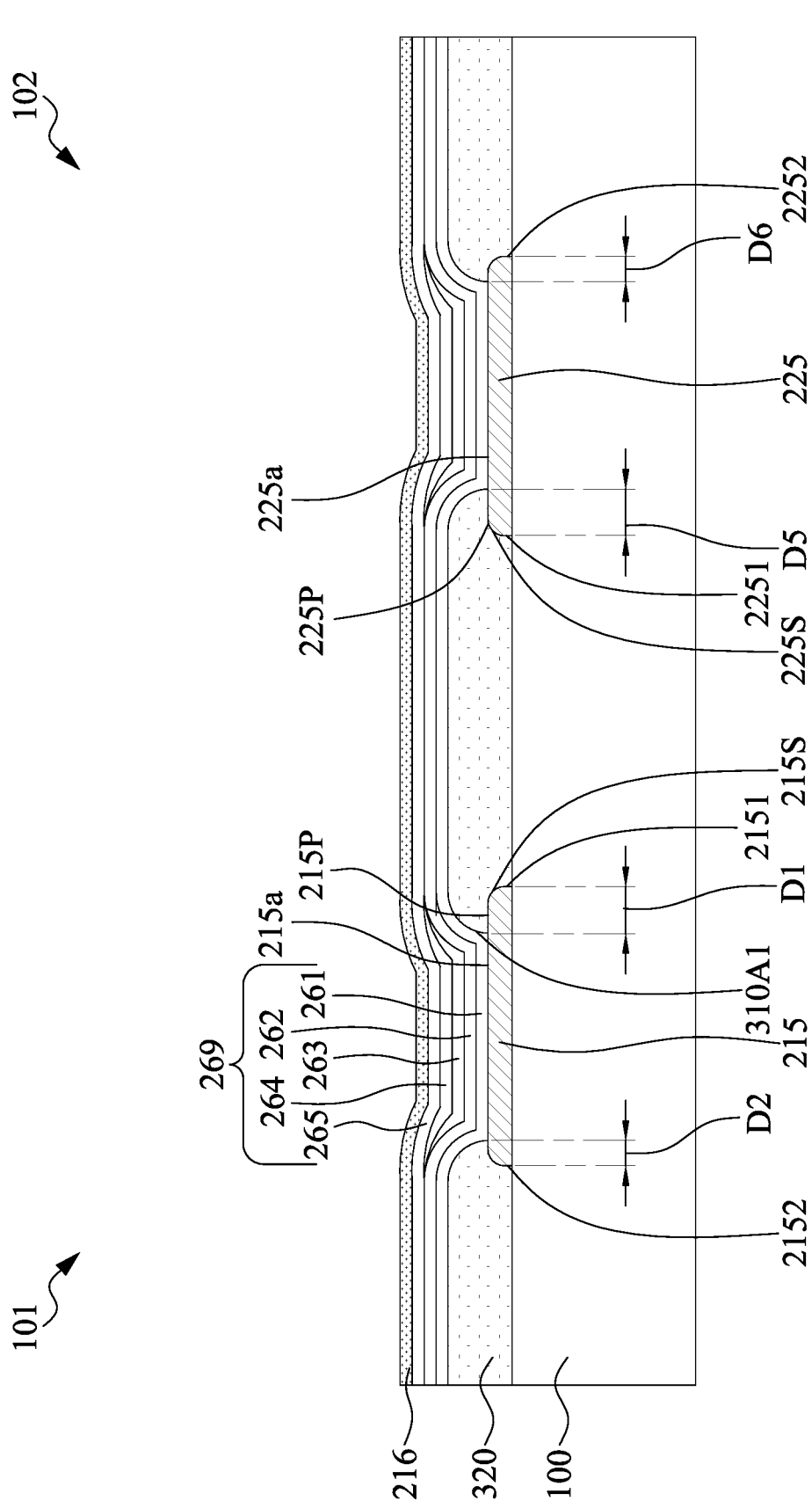
FIG. 4D is a section diagram along the line 4D-4D' in FIG. 4C as an example.

FIG. 4C shows a top view of a light emitting element according to some embodiments, and FIG. 4D shows a section diagram along the line 4D-4D' in FIG. 4C as an example. In some embodiments, FIG. 4D is a section diagram along the line A-A in FIG. 1 as an example, and only a light emitting region is illustrated. In some embodiments, FIG. 4D is a section diagram along the line 4D-4D' in FIG. 4C, and is used to merely illustrate a light emitting region. For brevity and clarity, the cover layer 40 is omitted.

In some embodiments, a cladding layer (for example, the cladding layer 200A, 200B) and an insulating photosensitive material layer (for example, the insulating photosensitive material layer 300) are formed as an integral and are made of the same non-conductive material so as to form an isolation structure 320, and the isolation structure 320 covers a non-light emitting region of the light emitting element. In some embodiments, a plurality of protrusions (for example, the protrusion 310A and the protrusion 310B) are connected to each other and are made of the same non-conductive material so as to form the isolation structure 320. In some embodiments, the isolation structure 320 covers a non-light emitting region over the substrate 100. In some embodiments, the isolation structure 320 covers the non-light emitting region of the light emitting element and exposes only the effective light emitting region of the organic light emitting unit.

Figure 5A:
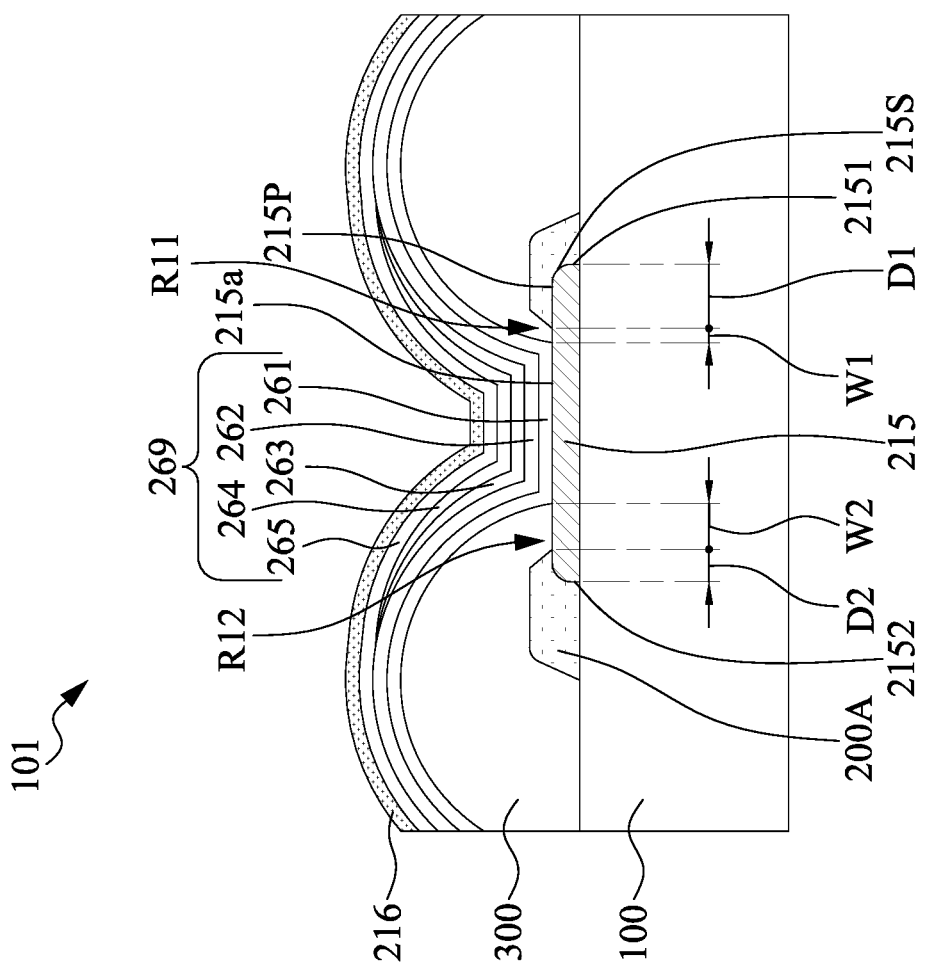
FIG. 5A is a section diagram of a light emitting element according to some embodiments.

FIG. 5A shows a section diagram of a light emitting element according to some embodiment. In some embodiments, FIG. 5A is a section diagram along the line A-A in FIG. 1 as an example, and only a light emitting region is illustrated. For brevity and clarity, the cover layer 40 is omitted.

In some embodiments, the insulating photosensitive material layer 300 has a curved surface 212 protruding from the substrate 100, and a portion of the organic layer 269 is located over the curved surface 212.

In some embodiments, the cladding layer 200A has a flat upper surface and an inclined sidewall. In some embodiments, the cladding layer 200B has a flat upper surface and an inclined sidewall.

In some embodiments, the electrode 215 has an edge 2151 and an edge 2152 opposite to the edge 2151, the portion 215P of the upper surface 215a of the electrode 215 extends inward from the edge 2151 by a distance D1, the portion 215P of the upper surface 215a of the electrode 215 extends inward from the edge 2152 by a distance D2, and the distance D1 is greater than the distance D2.

In some embodiments, the insulating photosensitive material layer 300 is in contact with the region R11 of the upper surface 215a of the electrode 215 near the edge 2151, the insulating photosensitive material layer 300 is in contact with the region R12 of the upper surface 215a of the electrode 215 near the edge 2152, and the width W1 of the region R11 is smaller than the width W2 of the region R12.

Figure 5B:
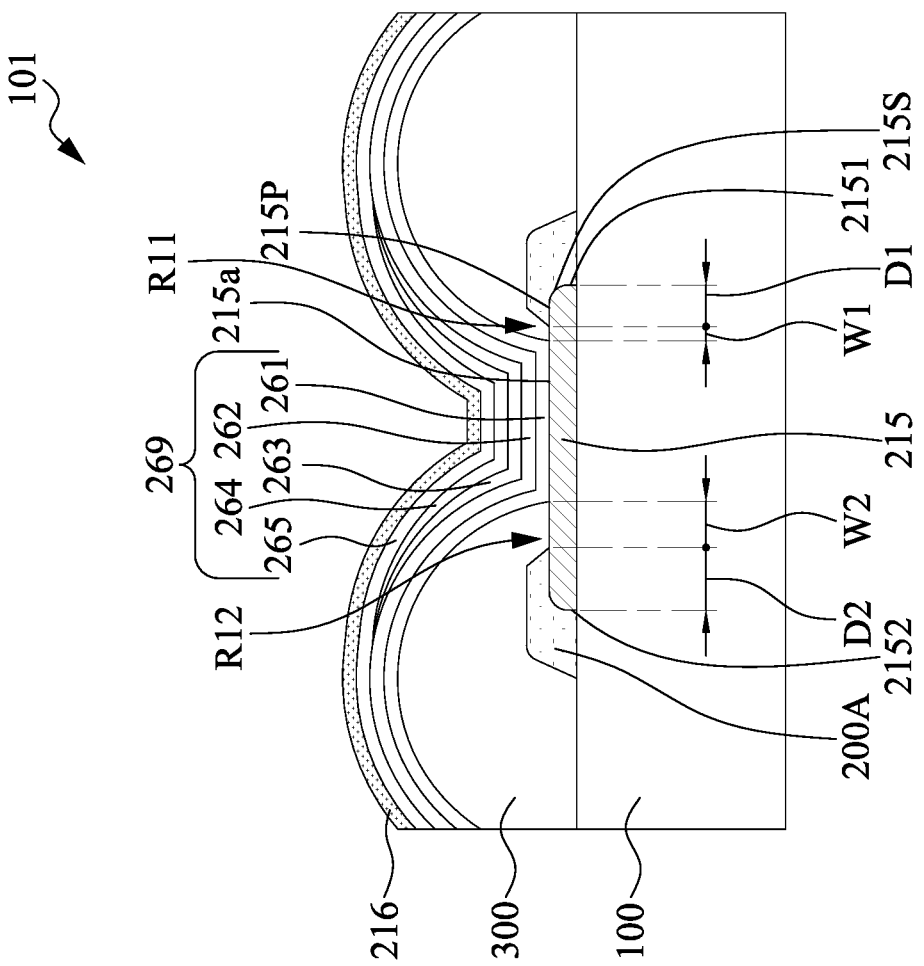
FIG. 5B is a section diagram of a light emitting element according to some embodiments.

FIG. 5B shows a section diagram of a light emitting element according to some embodiments. In some embodiments, FIG. 5B is a section diagram along the line A-A in FIG. 1 as an example, and only a light emitting region is illustrated. For brevity and clarity, the cover layer 40 is omitted.

In some embodiments, the insulating photosensitive material layer 300 has a curved surface 212 protruding from the substrate 100, and a portion of the organic layer 269 is located over the curved surface 212.

In some embodiments, the electrode 215 has an edge 2151 and an edge 2152 opposite to the edge 2151, a portion 215P of the upper surface 215a of the electrode 215 extends inward from the edge 2151 by a distance D1, the portion 215P of the upper surface 215a of the electrode 215 extends inward from the edge 2152 by a distance D2, and the distance D1 is smaller than the distance D2.

In some embodiments, the insulating photosensitive material layer 300 is in contact with the region R11 of the upper surface 215a of the electrode 215 near the edge 2151, the insulating photosensitive material layer 300 is in contact with the region R12 of the upper surface 215a of the electrode 215 near the edge 2152, and the width W1 of the region R11 is smaller than the width W2 of the region R12.

Figure 6A:
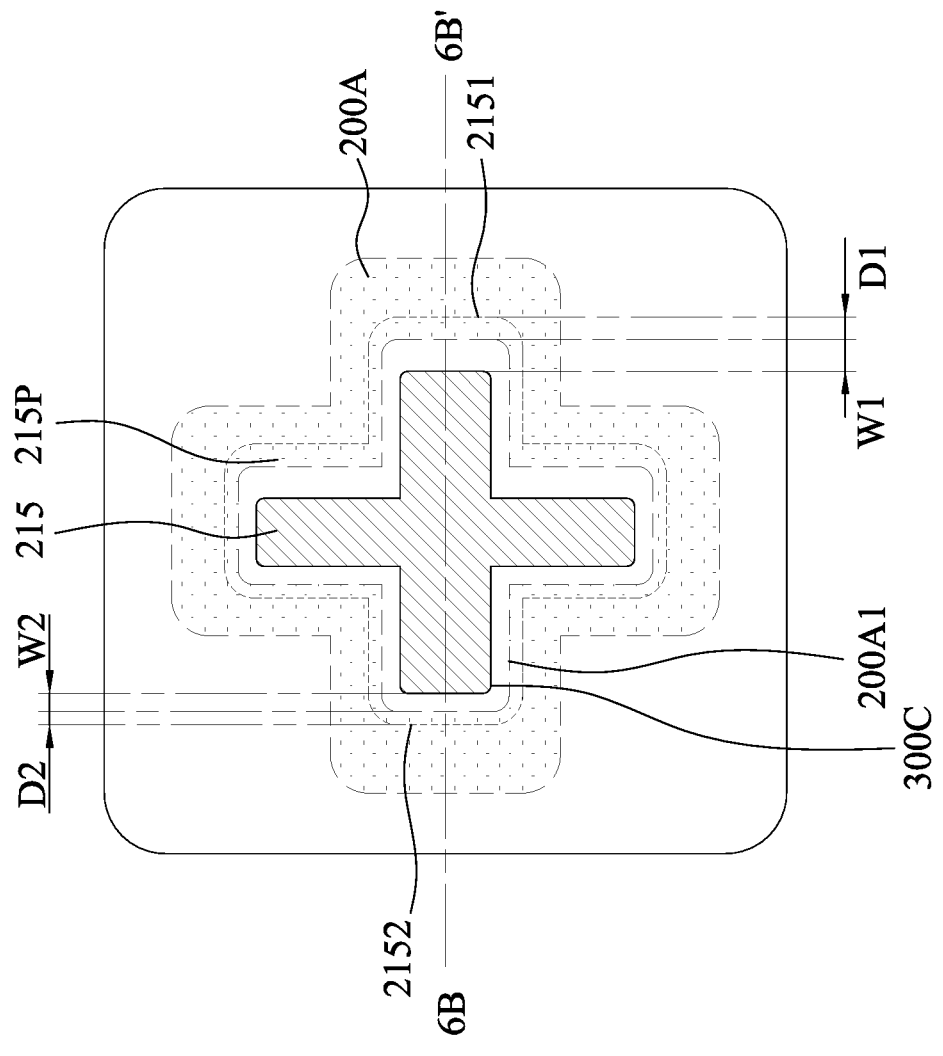
FIG. 6A is a top view of a light emitting element according to some embodiments.
Figure 6B:
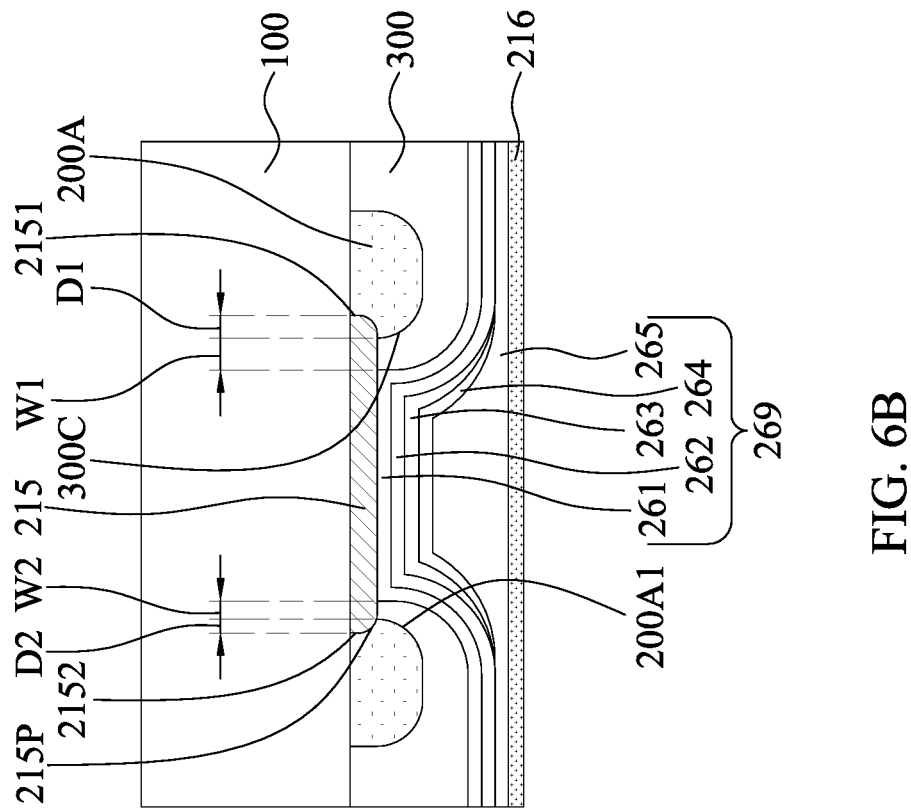
FIG. 6B is a section diagram along the line 6B-6B' in FIG. 6A as an example.

FIG. 6A shows a top view of a light emitting element according to some embodiments, and FIG. 6B shows a section diagram along the line 6B-6B' in FIG. 6A as an example. In some embodiments, FIG. 6B is a section diagram along the line A-A in FIG. 1 as an example, and only a light emitting region is illustrated. In some embodiments, FIG. 6B is a section diagram along the line 6B-6B' in FIG. 6A, and only a light emitting region is illustrated. For brevity and clarity, the cover layer 40 is omitted.

In some embodiments, the light emitting element further includes a transparent substrate 100, and the organic light emitting unit 101 and the organic light emitting unit 102 are disposed over the transparent substrate 100. In some embodiments, the light emitting elements shown in FIG. 6A and FIG. 6B are back-lit light emitting elements. In some embodiments, the transparent substrate 100 may include a glass substrate. In some embodiments, the electrode 215 is a transparent electrode, and the electrode 216 is a reflective electrode.

In some embodiments, the electrode 215 has a cross-shaped profile from a top view. In some embodiments, the through hole 200A1 of the cladding layer 200a has a cross-shape profile from a top view. In some embodiments, the recess 300C of the insulating photosensitive material layer 300 has a cross-shaped profile from a top view.

In some embodiments, the center of the electrode 215 and the center of the recess 300C over the electrode 215 are not aligned. In some embodiments, the center of the electrode 215 and the center of the through hole 200A1 of the cladding layer 200A are not aligned.

Figure 7A:
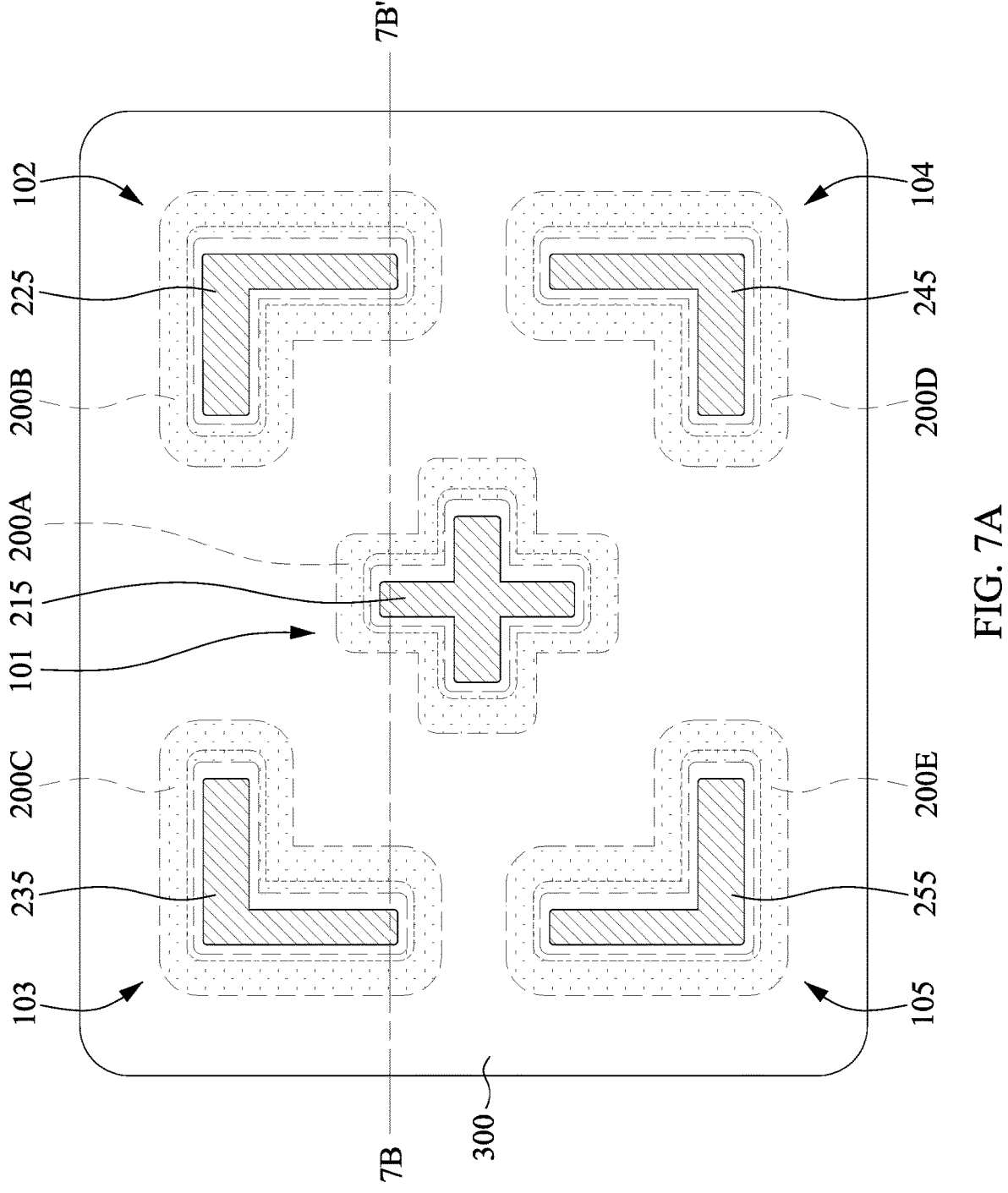
FIG. 7A is a top view of a light emitting element according to some embodiments.
Figure 7B:
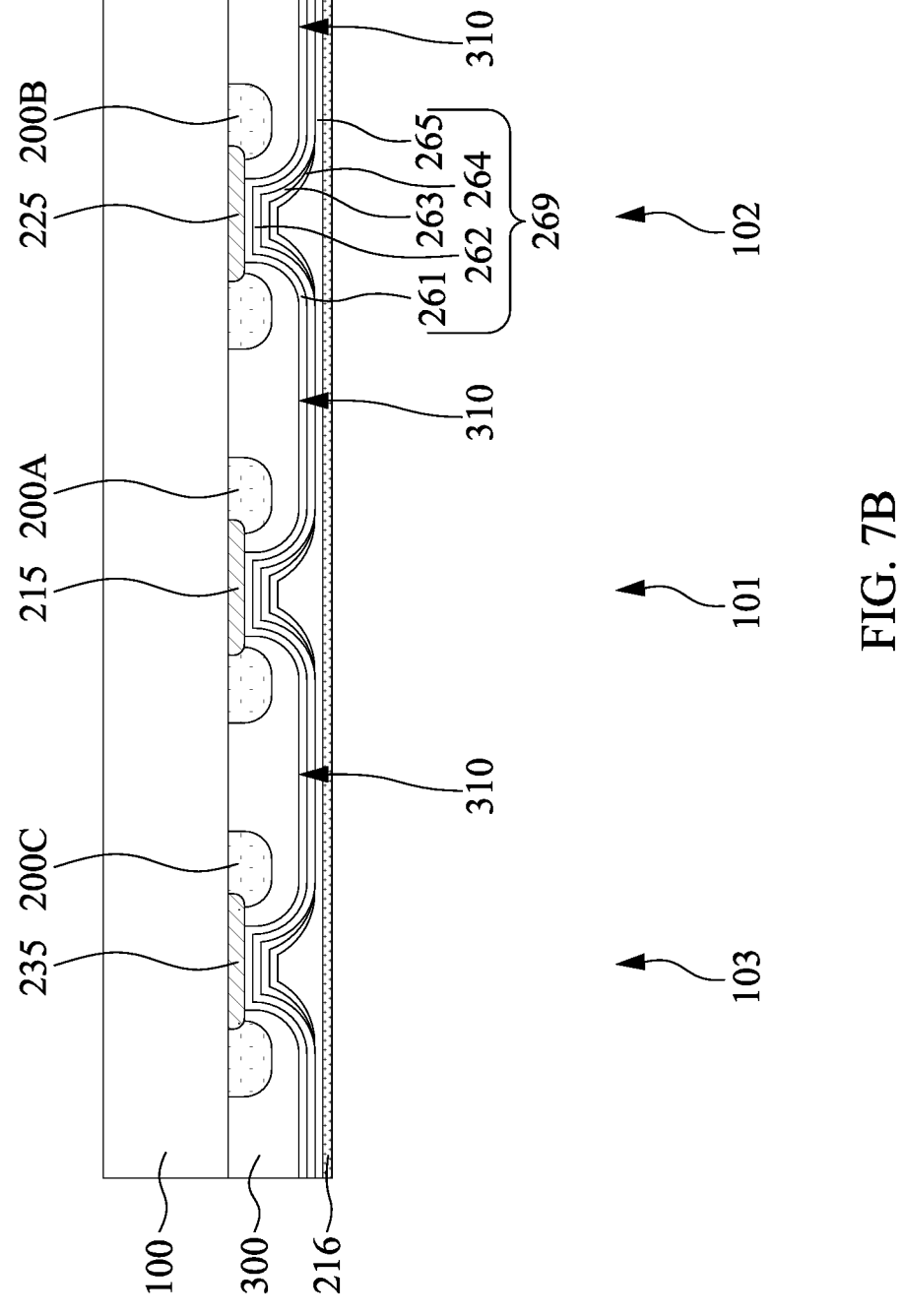
FIG. 7B is a section diagram along the line 7B-7B' in FIG. 7A as an example.

FIG. 7A shows a top view of a light emitting element according to some embodiments, and FIG. 7B shows a section diagram along the line 7B-7B' in FIG. 7A. In some embodiments, FIG. 7B is a section diagram along the line A-A in FIG. 1 as an example, and only a light emitting region is illustrated. In some embodiments, FIG. 7B is a section diagram along the line 7B-7B' in FIG. 7A as an example, and only a light emitting region is illustrated. For brevity and clarity, the cover layer 40 is omitted.

In some embodiments, the light emitting arrays shown in FIG. 7A and FIG. 7B include a plurality of organic light emitting diodes, for example, including at least organic light emitting diodes 101, 102, 103, 104 and 105. In some embodiments, the organic light emitting diodes 101, 102, 103, 104 and 105 are among the protrusions 310 and over (or under) the substrate 100.

In some embodiments, the organic light emitting diode 101 includes an electrode 215, the organic light emitting diode 102 includes an electrode 225, the organic light emitting diode 103 includes an electrode 235, the organic light emitting diode 104 includes an electrode 245, and the organic light emitting diode 105 includes an electrode 255. In some embodiments, the electrode 215, the electrode 225, the electrode 235, the electrode 245 and the electrode 255 are anodes. In some embodiments, the second electrode 216 is a common electrode (or a common cathode) of all organic light emitting units in the light emitting elements of the second electrode 216.

In some embodiments, the cladding layer 200A surrounds a sidewall of the organic light emitting unit 101. In some embodiments, the cladding layer 200B surrounds the sidewall of the organic light emitting unit 102. In some embodiments, the cladding layer 200C surrounds a sidewall of the organic light emitting unit 103. In some embodiments, the cladding layer 200D surrounds a sidewall of the organic light emitting unit 104. In some embodiments, the cladding layer 200E surrounds a sidewall of the organic light emitting unit 105.

In some embodiments, at least two of the electrode 215, the electrode 225, the electrode 235, the electrode 245 and the electrode 255 have different profiles. In some embodiments, the electrode 215, the electrode 225, the electrode 235, the electrode 245 and the electrode 255 may form a specific light emitting pattern.

In some embodiments, at least two of the organic light emitting diodes 101, 102, 103, 104 and 105 emit light having the same wavelength. In some embodiments, the organic light emitting diodes 101, 102, 103, 104 and 105 emit light having the same wavelength. In some embodiments, the organic light emitting diodes 101, 102, 103, 104 and 105 are arranged as a same group that emits light having the same color.

FIG. 8A to FIG. 13B depict a method for manufacturing a light emitting element according to some embodiments.

Figure 8A:
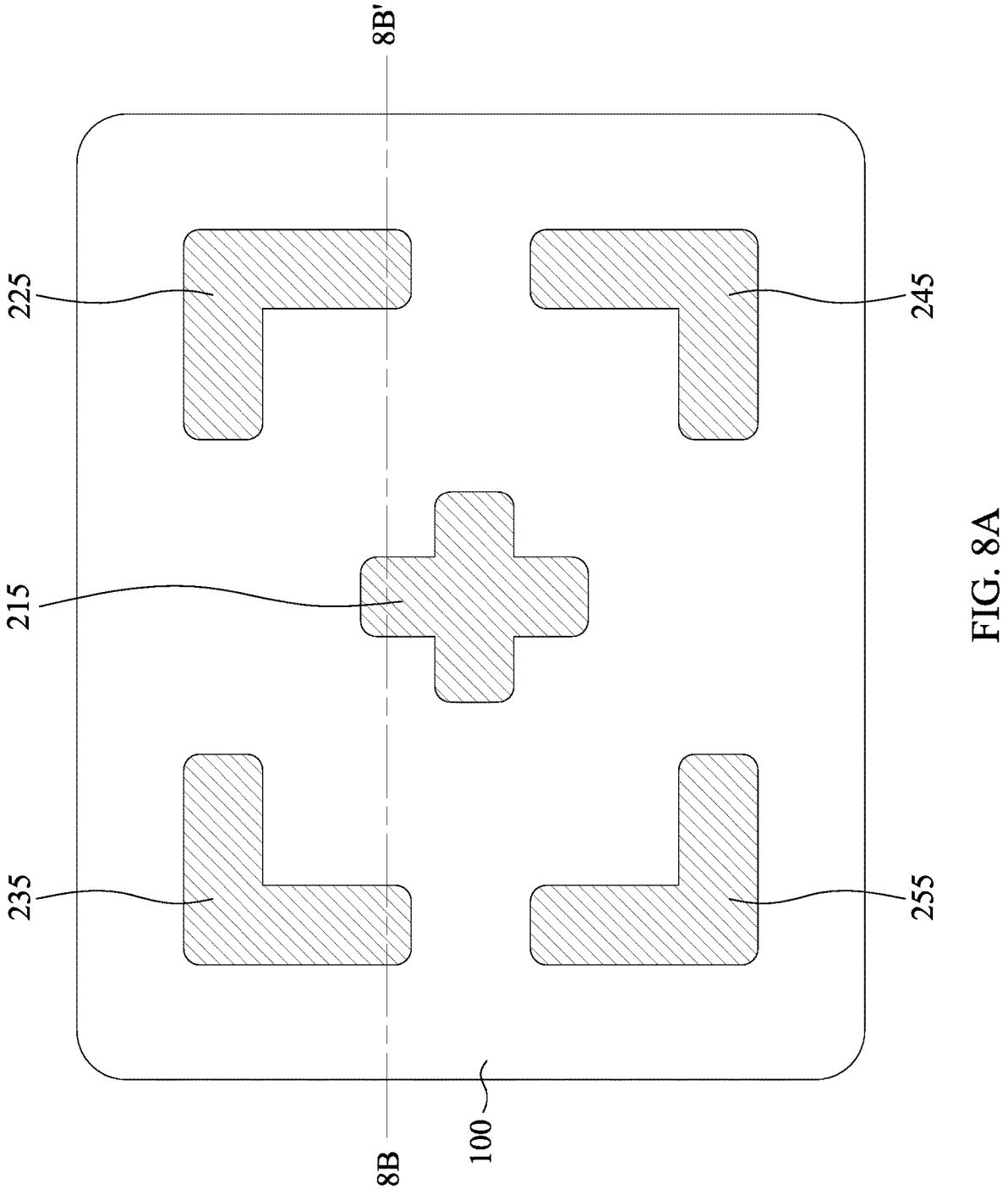
FIG. 8A to FIG. 13B depict a method for manufacturing a light emitting element according to some embodiments.
Figure 8B:
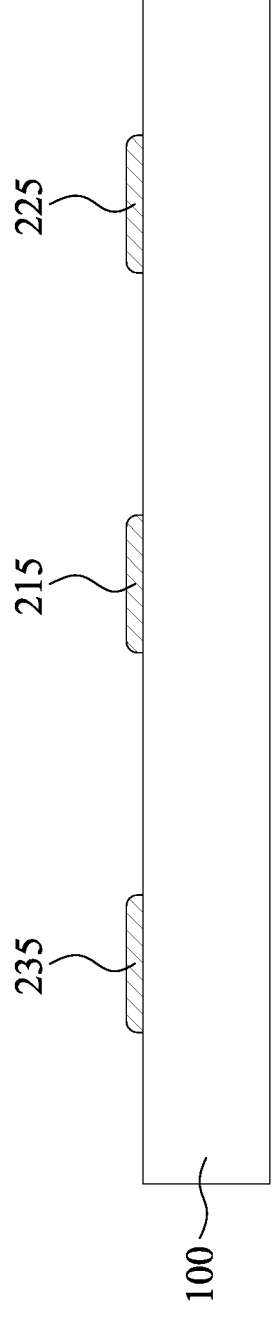

As shown in FIG. 8A and FIG. 8B, FIG. 8A shows a top view, and FIG. 8B shows a section diagram along the line 8B-8B' in FIG. 8A as an example.

In some embodiments, a plurality of electrodes 215, 225, 235, 245 and 255 are formed over the substrate 100. In some embodiments, the electrodes 215, 225, 235, 245 and 255 form an electrode array pattern. In some embodiment, the arrangement of a light emitting pattern is considered so as to design an electrode array pattern.

Figure 9A:
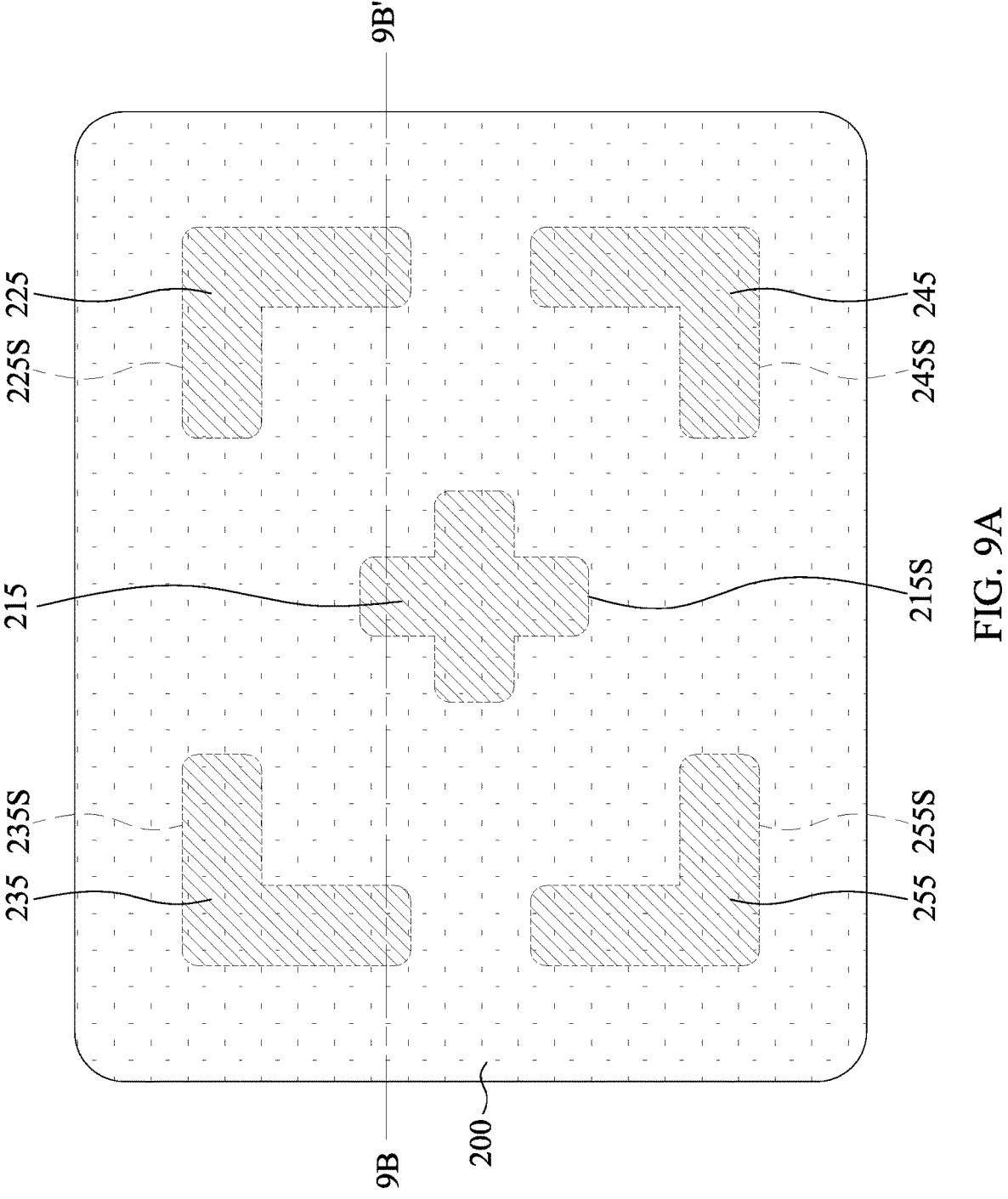
Figure 9B:
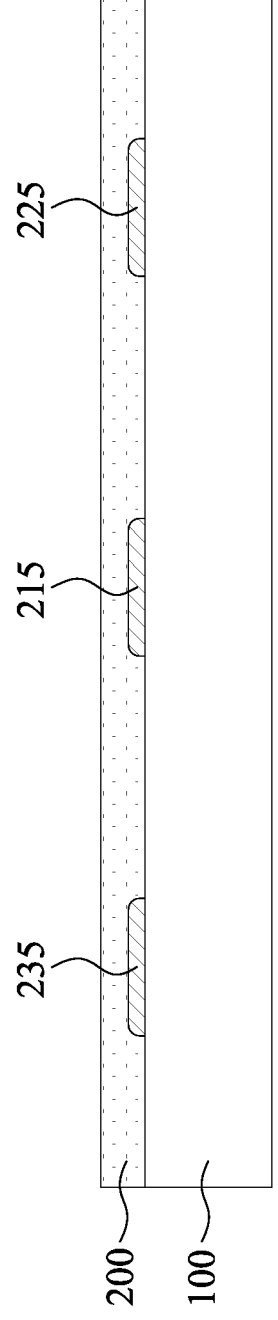

As shown in FIG. 9A and FIG. 9B, FIG. 9A shows a top view, and FIG. 9B shows a section diagram along the line 9B-9B' in FIG. 9A as an example.

In some embodiments, a cladding material layer 200 is formed over the electrodes 215, 225, 235, 245 and 255. In some embodiments, the cladding material layer 200 is coated over the electrodes 215, 225, 235, 245 and 255 and the substrate 100. In some embodiments, the cladding material layer 200 may be formed by a spin coating process or a deposition process.

In some embodiments, the cladding material layer 200 includes a conductor. In some embodiments, the cladding material layer 200 includes metal, resin, graphite or any combination of the above.

In some embodiments, the cladding material layer 200 includes a photosensitive material. In some embodiments, the cladding material layer 200 includes quantum dots. In some embodiments, the cladding material layer 200 includes a carbon black material, for example, carbon black nanoparticles, conductive fibers containing carbon black, or the like.

In some embodiments, the cladding layer 200 include a black material, which have an absorption rate of 90%, 95%, 99%, 99.5% or above 99.5% for visible light.

Figure 10A:
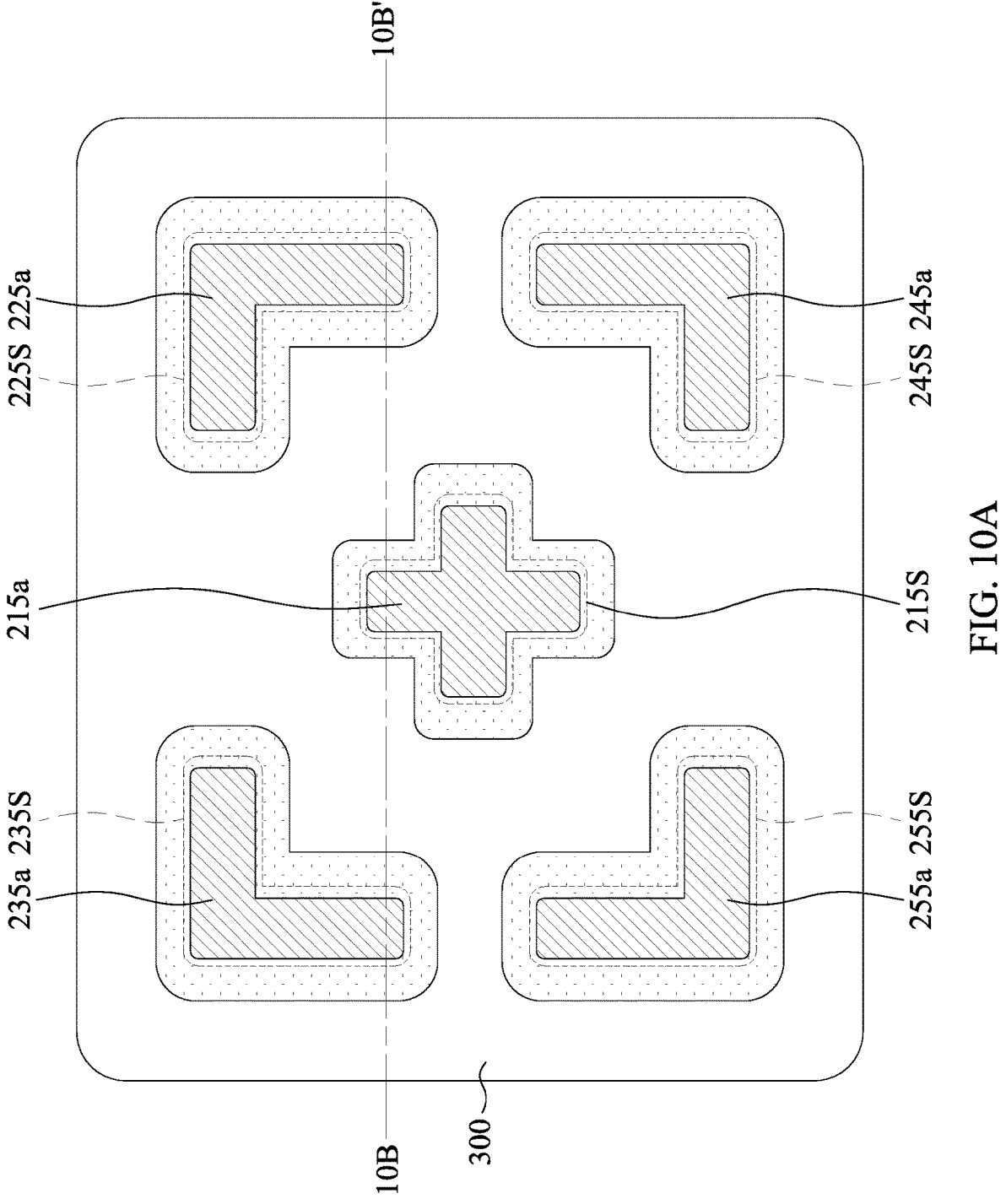
Figure 10B:
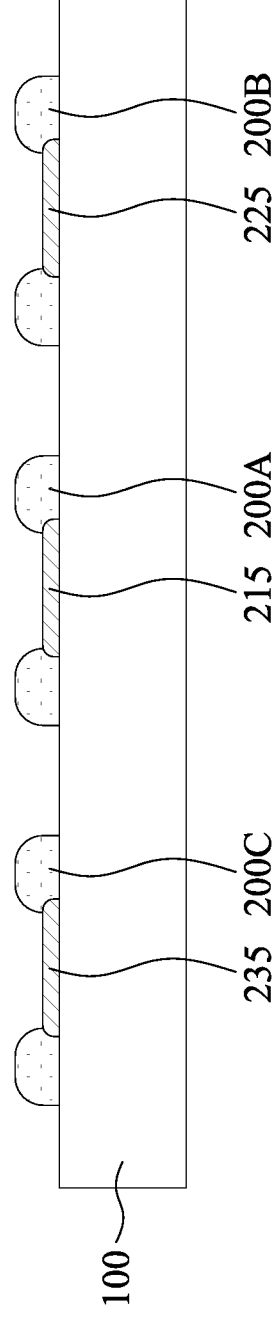

As shown in FIG. 10A and FIG. 10B, FIG. 10A shows a top view, and FIG. 10B shows a section diagram along the line 10B-10B' in FIG. 10A as an example.

In some embodiments, the cladding material layer 200 is patterned to form a plurality of cladding layers 200A, 200B, 200C, 200D and 200E, which surround sidewalls 215S, 225S, 235S, 245S and 255S of the electrodes 215, 225, 235, 245 and 255 and expose the upper surfaces 215a, 225a, 235a, 245a and 255a of the electrodes 215, 225, 235, 245 and 255. In some embodiments, the cladding layers 200A, 200B, 200C, 200D and 200E are non-continuous from one another among the electrodes 215, 225, 235, 245 and 255. In some embodiments, the cladding material layer 200 may be patterned by a photolithography process.

In some embodiments, after the exposure, the cladding material layer 200 is wet in a solution so as to perform development. As shown in FIG. 10B, a portion of the cladding material layer 200 is removed so as to form the cladding layers 200A, 200B, 200C, 200D and 200E. In some embodiments, after the cladding layers 200A, 200B, 200C, 200D and 200E are formed, a cleaning operation may be performed to clean the exposed surfaces of the cladding layers 200A, 200B, 200C, 200D, and 200E and the electrodes 215, 225, 235, 245, and 255. In some embodiments, the cleaning operation may be performed at a temperature between 30° C. and 80° C. In some embodiments, for example, water or isopropanol (IPA) may be used as a cleaning agent, and ultrasonic waves may be used to perform the cleaning operation.

Figure 11A:
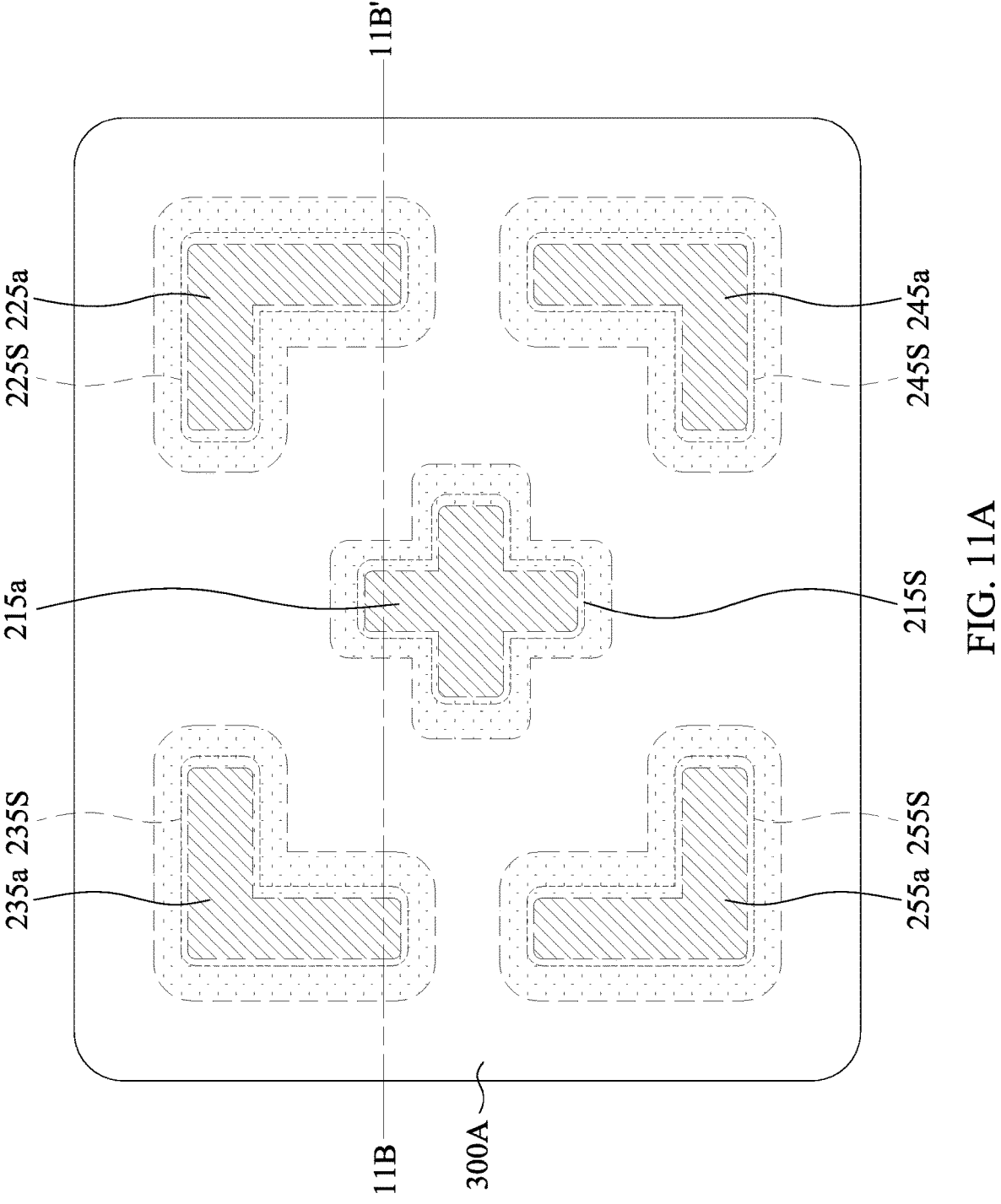
Figure 11B:
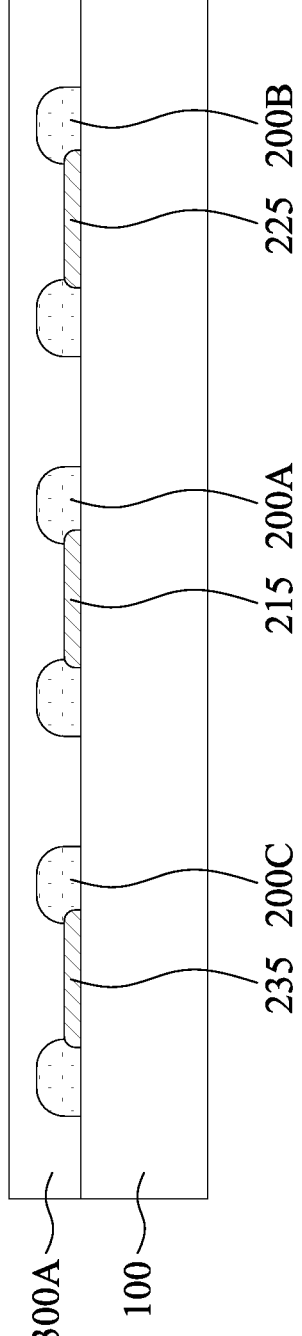

As shown in FIG. 11A and FIG. 11B, FIG. 11A shows a top view, and FIG. 11B shows a section diagram along the line 11B-11B' in FIG. 11A as an example.

In some embodiments, the insulating photosensitive material 300A may be disposed over the electrodes 215, 225, 235, 245 and 255 and the cladding layers 200A, 200B, 200C, 200D and 200E. In some embodiments, the insulating photosensitive material 300A may be formed by a spin coating process or a deposition process.

In some embodiments, the insulating photosensitive material 300A includes a photosensitive material. In some embodiments, the insulating photosensitive material 300A includes a black material, which has an absorption rate of greater than 90% for visible light. In some embodiments, the absorption rates of the cladding layers 200A, 200B, 200C, 200D and 200E for light having a specific wavelength is greater than the absorption rate of the insulating photosensitive material 300A for light having the specific wavelength. In some embodiments, the specific wavelength is not greater than 400 nm, not greater than 350 nm, not greater than 300 nm, not greater than 250 nm, not greater than 200 nm, or not greater than 150 nm.

Figure 12A:
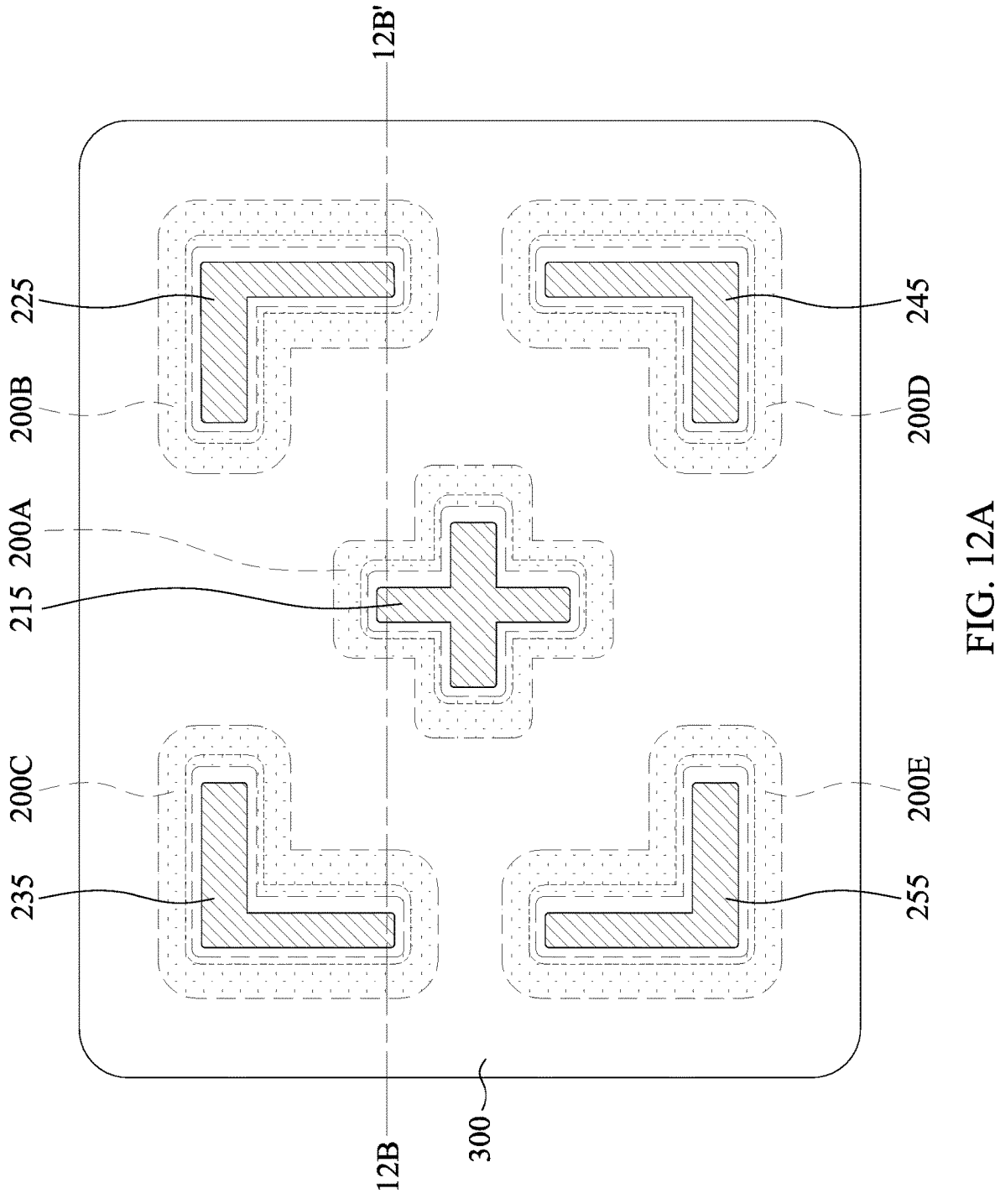
Figure 12B:
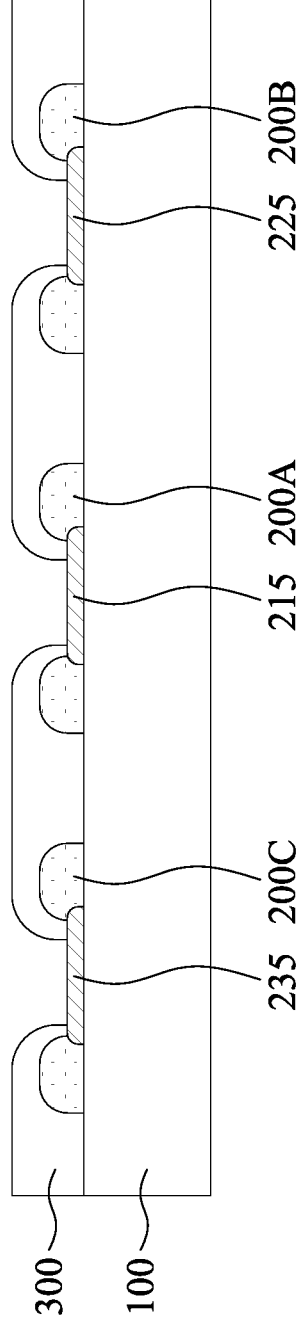

As shown in FIG. 12A and FIG. 12B, FIG. 12A shows a top view, and FIG. 12B shows a section diagram along the line 12B-12B' in FIG. 12A as an example.

In some embodiments, the insulating photosensitive material 300A is patterned to form the insulating photosensitive material layer 300, which exposes the plurality of effective light emitting regions of the upper surfaces 215a, 225a, 235a, 245a and 255a of the electrodes 215, 225, 235, 245 and 255. In some embodiments, the insulating photosensitive material 300A may be patterned by a photolithography process.

In some embodiments, after the exposure, the insulating photosensitive material 300A is wet in a solution so as to perform development. As shown in FIG. 12B, a portion of the insulating photosensitive material 300A is removed so as to form the insulating photosensitive material layer 300. In some embodiments, after the insulating photosensitive material layer 300 is formed, a cleaning operation may be performed to clean the insulating photosensitive material layer 300 and the exposed surfaces of the electrodes 215, 225, 235, 245 and 255. In some embodiments, the cleaning operation may be performed at a temperature between 30° C. and 80° C. In some embodiments, for example, water or isopropanol (IPA) may be used as a cleaning agent, and ultrasonic waves may be used to perform the cleaning operation.

15

Figure 13A:
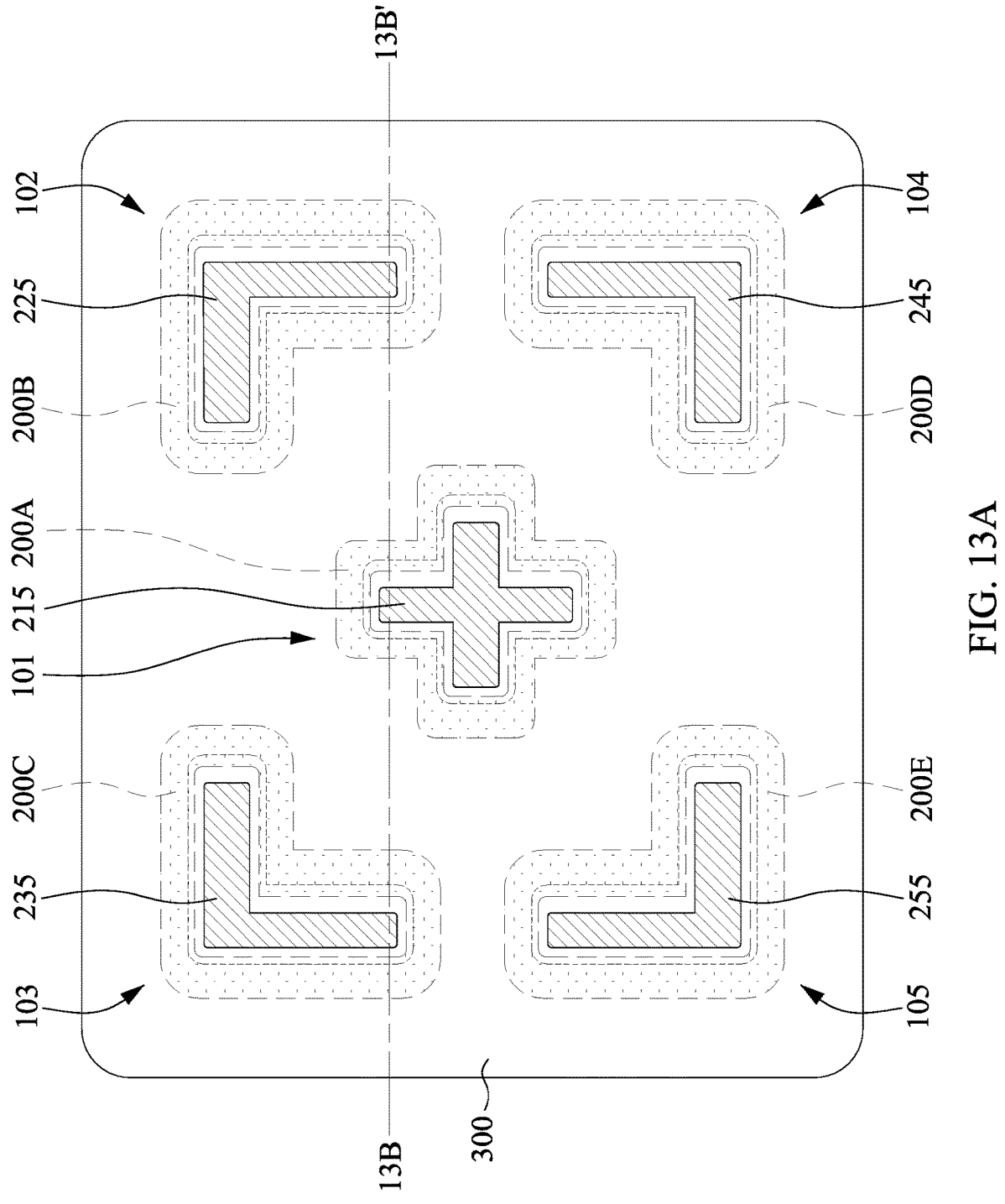
Figure 13B:
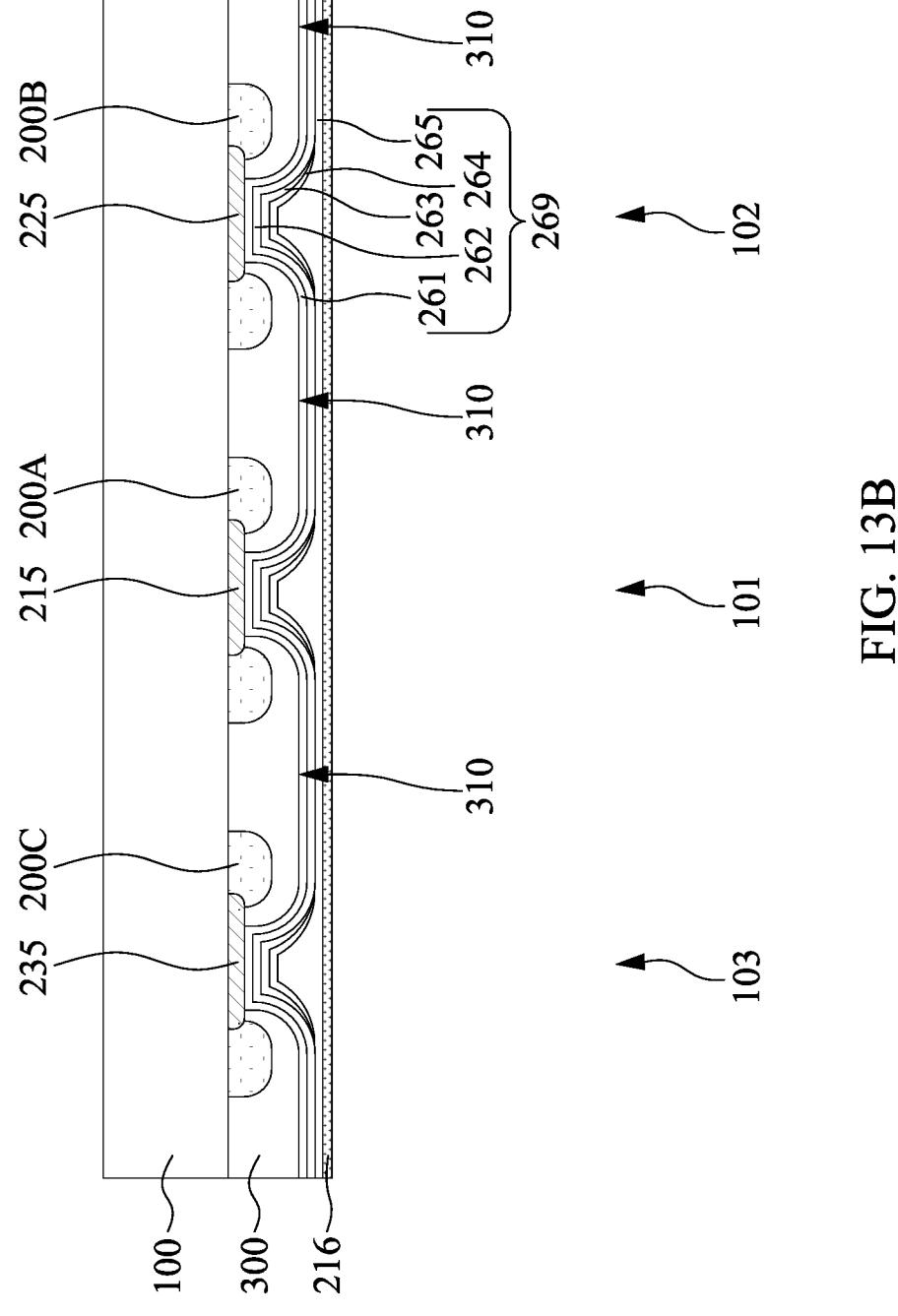

As shown in FIG. 13A and FIG. 13B, FIG. 13A shows a top view, and FIG. 13B shows a section diagram along the line 13-13B' in FIG. 13A as an example.

In some embodiments, an organic light emitting material is disposed over the effective light emitting regions of the upper surfaces 215a, 225a, 235a, 245a and 255a of the electrodes 215, 225, 235, 245 and 255. In some embodiments, the electrode 216 is disposed over the organic light emitting material.

In some embodiments, the carrier injection layer 261, the first carrier transport layer 262, the second carrier transport layer 263, the organic emitting layer 264 and the organic carrier transport layer 265 are sequentially disposed over the insulating photosensitive material layer 300 and the exposed upper surfaces 215a, 225a, 235a, 245a and 255a of the electrodes 215, 225, 235, 245 and 255. In some embodiments, each organic light emitting unit has respective second carrier transport layer 263 and organic emitting layer 264.

The features of some embodiments are given in brief in the description above for a person skilled in the art to better understand various aspects of the present disclosure. A person skilled in the art would be able to understand that the present disclosure can be used as the basis for designing or modifying other manufacturing processes and structures so as to achieve the same objects and/or the same advantages of the embodiments described in the present application. A person skilled in the art would also be able to understand that such structures do not depart from the spirit and scope of the disclosure of the present application, and various changes, substitutions and replacements may be made by a person skilled in the art without departing from the spirit and scope of the present disclosure.

Details and technical contents of the present disclosure are given with the accompanying drawings below. It should be noted that the accompanying drawings are for illustration purposes and are not to be construed as limitations to the present disclosure.

What is claimed is:

1. A light emitting element, comprising:
a light emitting array comprising a first organic light emitting unit and a second organic light emitting unit, wherein the first organic light emitting unit comprises a first electrode, and the second organic light emitting unit comprises a second electrode;
a plurality of cladding layers comprising:
a first cladding layer covering a portion of an upper surface of the first electrode and a sidewall of the first electrode; and
a second cladding layer covering a portion of an upper surface of the second electrode and a sidewall of the first electrode; and
an insulating photosensitive material layer located between the sidewall of the first electrode and the sidewall of the second electrode, wherein the insulating photosensitive material layer partially covers the upper surface of the first electrode, wherein the first electrode has a first edge and a second edge opposite to or adjacent to the first edge, the portion of the upper surface of the first electrode extends inward from the first edge by a first distance, the portion of the upper surface of the first electrode extends inward from the second edge by a second distance, and the first distance is greater than the second distance.

2. The light emitting element according to claim 1, wherein an absorption rate of the plurality of cladding layers for light is greater than an absorption rate of the insulating photosensitive material layer for the light.

3. The light emitting element according to claim 1, wherein the plurality of cladding layers and the insulating photosensitive material layer are formed integrally and are made of a same material.

4. The light emitting element according to claim 1, wherein the plurality of cladding layers and the insulating photosensitive material layer are formed integrally and are made of a same non-conductive material so as to form an isolation structure, which covers a non-light emitting region of the light emitting element.

5. The light emitting element according to claim 1, wherein the plurality of cladding layers comprise a conductor, and the plurality of cladding layers are separated from one another.

6. The light emitting element according to claim 1, wherein the plurality of cladding layers comprise metal, resin, graphite or any combination of the above.

7. The light emitting element according to claim 1, wherein the plurality of cladding layers comprise a photosensitive material.

8. The light emitting element according to claim 1, further comprising a transparent substrate, wherein the first organic light emitting unit and the second organic light emitting unit are disposed over the transparent substrate.

9. The light emitting element according to claim 1, wherein the insulating photosensitive material layer is in contact with a first region and a second region of the upper surface of the first electrode, the first region being adjacent to the first edge and the second region being adjacent to the second edge, a width of the first region is not equal to a width of the second region, and/or an area of the first region is not equal to an area of the second region.

10. The light emitting element according to claim 1, wherein the first electrode and the second electrode are anodes, and/or the first electrode and the second electrode comprise a transparent conductive material.

11. The light emitting element according to claim 1, wherein the first organic light emitting unit and the second organic light emitting unit emit light having a same wavelength.

12. A light emitting element, comprising:
a plurality of light emitting units comprising a first electrode and a second electrode;
an insulating photosensitive material layer partially covering the plurality of light emitting units, the insulating photosensitive material layer comprising a plurality of recesses for exposing a plurality of effective light emitting regions of the plurality of light emitting units; and
a plurality of cladding layers, each of the cladding layers surrounding a sidewall of each of the light emitting units, and each of the cladding layers being between the sidewalls of two adjacent ones of the organic light emitting units, wherein the plurality of cladding layers cover a portion of an upper surface of the first electrode, and wherein the first electrode has a first edge and a second edge opposite to or adjacent to the first edge, the portion of the upper surface of the first electrode extends inward from the first edge by a first distance, the portion of the upper surface of the first electrode extends inward from the second edge by a second distance, and the first distance is greater than the second distance.

13. The light emitting element according to claim 12, wherein an absorption rate of the plurality of cladding layers for light is greater than an absorption rate of the insulating photosensitive material layer for the light.

14. The light emitting element according to claim 12, wherein the plurality of cladding layers and the insulating photosensitive material layer are formed integrally and are made of a same material.

15. The light emitting element according to claim 12, wherein the plurality of cladding layers comprise a conductor, and the plurality of cladding layers are separated from one another.

16. The light emitting element according to claim 12, further comprising a transparent substrate, wherein the plurality of organic light emitting units are disposed over the transparent substrate.

17. A method for manufacturing a light emitting element, comprising:

providing a substrate;

forming a plurality of electrodes over the substrate;

forming a cladding material layer over the plurality of electrodes;

patterning the cladding material layer to form a plurality of cladding layers surrounding a plurality of sidewalls of the plurality of electrodes, and exposing a plurality of upper surfaces of the plurality of electrodes, wherein the plurality of cladding layers are not connected to one another among the plurality of electrodes;

disposing an insulating photosensitive material over the plurality of electrodes and the plurality of cladding layers;

patterning the insulating photosensitive material to form an insulating photosensitive material layer, which exposes a plurality of effective light emitting regions of the plurality of upper surfaces of the plurality of electrodes; and disposing an organic light emitting material over the plurality of effective light emitting regions of the plurality of electrodes, wherein the plurality of electrodes comprises a first electrode and a second electrode, and the plurality of cladding layers cover a portion of an upper surface of the first electrode, and wherein the first electrode has a first edge and a second edge opposite to or adjacent to the first edge, the portion of the upper surface of the first electrode extends inward from the first edge by a first distance, the portion of the upper surface of the first electrode extends inward from the second edge by a second distance, and wherein the first distance is greater than the second distance.

18. The method according to claim 17, wherein the organic light emitting material comprises an electron transport layer (ETL), an electron injection layer (EIL), a emitting layer (EM), a hole blocking layer (HBL), a hole injection layer (HIL), a hole transport layer (HTL) or any combination of the above.

19. The method according to claim 17, wherein the cladding material layer is formed by a spin coating process, a deposition process, or a photolithography process.

* * * * *